United States Patent
Kim et al.

(10) Patent No.: US 7,755,930 B2
(45) Date of Patent: Jul. 13, 2010

(54) SEMICONDUCTOR MEMORY DEVICE AND MAGNETO-LOGIC CIRCUIT

(75) Inventors: Kee-won Kim, Suwon-si (KR); Young-jin Cho, Suwon-si (KR); Hyung-soon Shin, Seoul (KR); Sung-hoon Choa, Seoul (KR); Seung-jun Lee, Seoul (KR); In-jun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 384 days.

(21) Appl. No.: 11/976,007

(22) Filed: Oct. 19, 2007

(65) Prior Publication Data
US 2008/0219045 A1 Sep. 11, 2008

(30) Foreign Application Priority Data
Mar. 7, 2007 (KR) .................. 10-2007-0022573

(51) Int. Cl.
*G11C 11/00* (2006.01)
(52) U.S. Cl. ................ 365/158; 365/148; 365/171; 365/189.08; 365/225.5; 977/935
(58) Field of Classification Search .......... 365/48, 365/66, 78, 80–93, 100, 130, 131, 148, 158, 365/171, 173, 225.5, 243.5; 216/22; 257/421, 257/E21.665; 438/3; 977/933–935
See application file for complete search history.

(56) References Cited

U.S. PATENT DOCUMENTS

| | | | |
|---|---|---|---|
| 7,098,494 B2 * | 8/2006 | Pakala et al. | 257/295 |
| 7,652,398 B2 * | 1/2010 | Koch et al. | 307/407 |
| 2006/0164124 A1 * | 7/2006 | Koch et al. | 326/104 |
| 2009/0273972 A1 * | 11/2009 | Han et al. | 365/173 |

OTHER PUBLICATIONS

Ney, A., Pampuch, C., Koch, R. & Ploog, K. H., Programmable computing with a single magnetoresistive element, Nature 425, 485-487 (2003).*

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

Provided are a semiconductor memory device and a magneto-logic circuit which change the direction of a magnetically induced current according to a logical combination of logic states of a plurality of input values. The semiconductor memory device comprises a current driving circuit, a magnetic induction layer, and a resistance-variable element. The current driving circuit receives a plurality of input values and changes the direction of a magnetically induced current according to a logical combination of logic states of the input values. The magnetic induction layer induces magnetism having a direction varying according to the direction of the magnetically induced current. The resistance-variable element has a resistance varying according to the direction of the magnetism induced by the magnetic induction layer.

17 Claims, 36 Drawing Sheets

| A | B | C | D |
|---|---|---|---|
| −I(0) | −I(0) | −I(0) | $R_L$(0) |
| −I(0) | −I(0) | +I(1) | $R_L$(0) |
| −I(0) | +I(1) | −I(0) | $R_L$(0) |
| +I(1) | −I(0) | −I(0) | $R_L$(0) |
| −I(0) | +I(1) | +I(1) | $R_H$(1) |
| +I(1) | −I(0) | +I(1) | $R_H$(1) |
| +I(1) | +I(1) | −I(0) | $R_H$(1) |
| +I(1) | +I(1) | +I(1) | $R_H$(1) |

FIG. 3B
| A | B | C | CURRENT | R |
|---|---|---|---------|---|
| 0 | 0 | 0 | $-3I$ | $R_L(0)$ |
| 0 | 0 | 1 | $-I$ | $R_L(0)$ |
| 0 | 1 | 0 | $-I$ | $R_L(0)$ |
| 1 | 0 | 0 | $-I$ | $R_L(0)$ |
| 0 | 1 | 1 | $+I$ | $R_H(1)$ |
| 1 | 0 | 1 | $+I$ | $R_H(1)$ |
| 1 | 1 | 0 | $+I$ | $R_H(1)$ |
| 1 | 1 | 1 | $+3I$ | $R_H(1)$ |
FIG. 3C
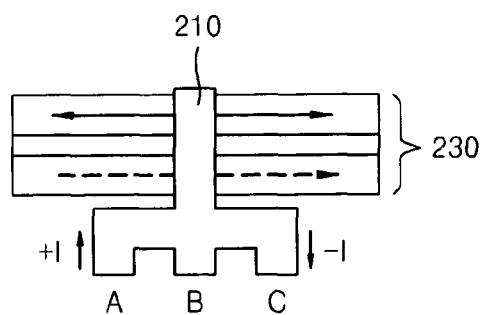
FIG. 3D
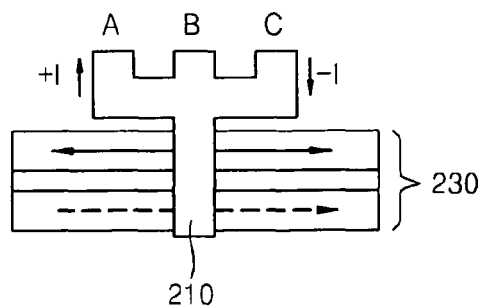

| A | B | C | CURRENT | R |
|---|---|---|---------|---|
| 0 | 0 | 0 | +3I | $R_H(1)$ |
| 0 | 0 | 1 | +I | $R_H(1)$ |
| 0 | 1 | 0 | +I | $R_H(1)$ |
| 1 | 0 | 0 | +I | $R_H(1)$ |
| 0 | 1 | 1 | −I | $R_L(0)$ |
| 1 | 0 | 1 | −I | $R_L(0)$ |
| 1 | 1 | 0 | −I | $R_L(0)$ |
| 1 | 1 | 1 | −3I | $R_L(0)$ |

| A | B | CURRENT | R |
|---|---|---------|---|
| 0 | 0 | -3I | $R_L(0)$ |
| 0 | 1 | -I | $R_L(0)$ |
| 1 | 0 | -I | $R_L(0)$ |
| 1 | 1 | +I | $R_H(1)$ |

| A | B | CURRENT | R |
|---|---|---------|---|
| 0 | 0 | −I | $R_L(0)$ |
| 0 | 1 | +I | $R_H(1)$ |
| 1 | 0 | +I | $R_H(1)$ |
| 1 | 1 | +3I | $R_H(1)$ |

| A | B | CURRENT | R |
|---|---|---------|---|
| 0 | 0 | +3I | $R_H(1)$ |
| 0 | 1 | +I | $R_H(1)$ |
| 1 | 0 | +I | $R_H(1)$ |
| 1 | 1 | -I | $R_L(0)$ |

| A | B | CURRENT | R |
|---|---|---------|---|
| 0 | 0 | +I | $R_H(1)$ |
| 0 | 1 | -I | $R_L(0)$ |
| 1 | 0 | -I | $R_L(0)$ |
| 1 | 1 | -3I | $R_L(0)$ |

S/A OUT = $V_+$ AND $\overline{V_-}$

| $V_+$ (R1) | $V_-$ (R2) | OUT |
|---|---|---|
| 0($R_L$) | 0($R_L$) | 0 |
| 0($R_L$) | 1($R_H$) | 0 |
| 1($R_H$) | 0($R_L$) | 1 |
| 1($R_H$) | 1($R_H$) | 0 |

S/A OUT = $V_+$ AND $\overline{V_-}$ $= (A \text{ OR } B) \cdot \overline{(A \text{ AND } B)}$ $= (A + B) \cdot (\overline{A} + \overline{B})$ $= A \cdot \overline{B} + \overline{A} \cdot B$ $= A \text{ XOR } B$ FIG. 11A
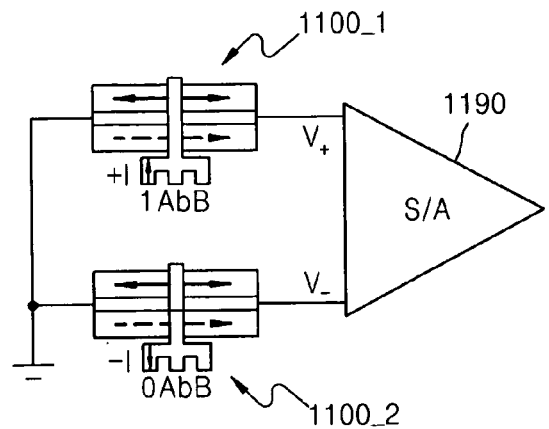
FIG. 11B
S/A OUT = $V_+$ AND $\overline{V_-}$
= $(\overline{A}$ OR $B) \cdot \overline{(\overline{A}\text{ AND }B)}$
= $(\overline{A} + B) \cdot (A + \overline{B})$
= $A \cdot B + \overline{A} \cdot \overline{B}$
= A XNOR B
FIG. 12A
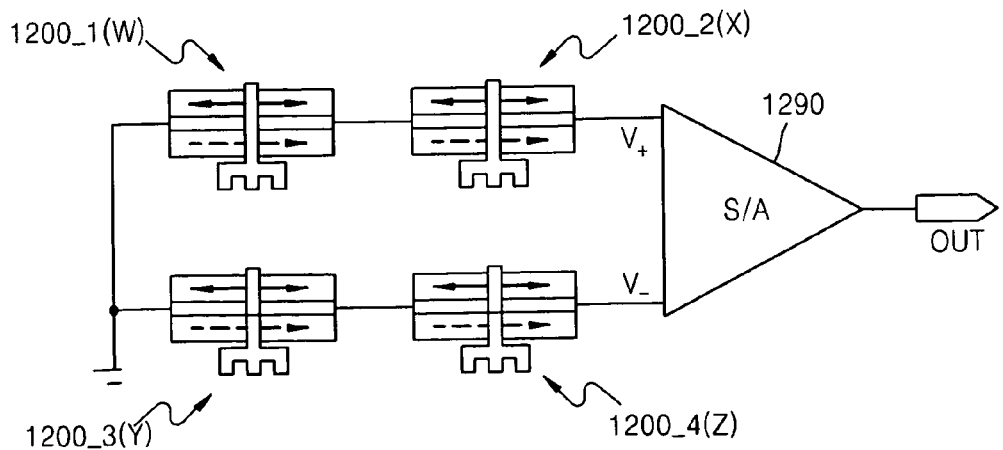

FIG. 12B

S/A OUT = (W + X) · $\overline{Y}$ · $\overline{Z}$ + ($\overline{Y}$ + $\overline{Z}$) · W · X

FIG. 12C

| W | X | Y | Z | OUT |
|---|---|---|---|-----|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 1 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 0 |

FIG. 13B $A_{NEXT} = (\overline{B} + C) \cdot \overline{(\overline{B} + C)}$
$\qquad = (\overline{B} + C) \cdot (B + \overline{C})$
$\qquad = \overline{B \oplus C}$ $B_{NEXT} = (\overline{A} + \overline{C}) \cdot \overline{(\overline{A} + \overline{B})}$
$\qquad = (\overline{A} + \overline{C}) \cdot (A + B)$
$\qquad = \overline{A} \cdot B + A \cdot \overline{C} + B \cdot \overline{C}$ $C_{NEXT} = (\overline{A} + C) \cdot \overline{(\overline{A} + \overline{B})}$
$\qquad = (\overline{A} + C) \cdot (A + B)$
$\qquad = \overline{A} \cdot B + A \cdot C + B \cdot C$

FIG. 13C

| Present State<br>C B A | Next State<br>C B A |
|---|---|
| 0 0 0 | 0 0 1 |
| 0 0 1 | 0 1 1 |
| 0 1 1 | 0 1 0 |
| 0 1 0 | 1 1 0 |
| 1 1 0 | 1 1 1 |
| 1 1 1 | 1 0 1 |
| 1 0 1 | 1 0 0 |
| 1 0 0 | 0 0 0 |

FIG. 14B $A_{NEXT} = (\overline{A} + B) \cdot \overline{(A \cdot B)} = (\overline{A} + B) \cdot (\overline{A} + \overline{B}) = \overline{A}$ $B_{NEXT} = (A + B) \cdot \overline{(A \cdot B)} = (A + B) \cdot (\overline{A} + \overline{B}) = A \cdot \overline{B} + \overline{A} \cdot B = A \oplus B$ $W = R_H(1)$ $X = A \cdot B + B \cdot C + C \cdot A$ $Y = A \cdot C$ $Z = B + \overline{C}$ $C_{NEXT} = \{(1 + A \cdot B + B \cdot C + C \cdot A) \cdot \overline{(A \cdot C)} \cdot \overline{(B + \overline{C})}\}$ $\quad\quad + \{(\overline{(A \cdot C)} + \overline{(B + \overline{C})}) \cdot (A \cdot B + B \cdot C + C \cdot A) \cdot 1\}$ $\quad\quad = \{\overline{(A \cdot C)} \cdot (\overline{B} \cdot C)\} + \{(\overline{(A \cdot C)} + (\overline{B} \cdot C)) \cdot (A \cdot B + B \cdot C + C \cdot A)\}$ $\quad\quad = \overline{A} \cdot \overline{B} \cdot C + \overline{A} \cdot B \cdot C + A \cdot B \cdot \overline{C} + A \cdot \overline{B} \cdot C$ $\quad\quad = A \cdot B \cdot \overline{C} + \overline{A} \cdot C + \overline{B} \cdot C$

FIG. 14C

| Present State C B A | Next State C B A |
|---|---|
| 0 0 0 | 0 0 1 |
| 0 0 1 | 0 1 0 |
| 0 1 0 | 0 1 1 |
| 0 1 1 | 1 0 0 |
| 1 0 0 | 1 0 1 |
| 1 0 1 | 1 1 0 |
| 1 1 0 | 1 1 1 |
| 1 1 1 | 0 0 0 |

FIG. 15B $$A_{NEXT} = (\bar{A} + B) \cdot \overline{(A \cdot B)} = (\bar{A} + B) \cdot (\bar{A} + \bar{B}) = \bar{A}$$

$$B_{NEXT} = (\bar{A} + B) \cdot \overline{(\bar{A} \cdot B)} = (\bar{A} + B) \cdot (A + \bar{B}) = A \cdot B + \bar{A} \cdot \bar{B} = \overline{A \oplus B}$$

$W = B \cdot C$ $X = \bar{A} \cdot \bar{B} + \bar{B} \cdot C + C \cdot \bar{A}$ $Y = R_L(0)$ $Z = \bar{A} \cdot C$ $$C_{NEXT} = \{(B \cdot C + \bar{A} \cdot \bar{B} + \bar{B} \cdot C + C \cdot \bar{A}) \cdot 1 \cdot \overline{(\bar{A} \cdot C)}\}$$
$$+ \{(1 + \overline{(\bar{A} \cdot C)}) \cdot (B \cdot C) \cdot (\bar{A} \cdot \bar{B} + \bar{B} \cdot C + C \cdot \bar{A})\}$$
$$= \{(B \cdot C + \bar{A} \cdot \bar{B} + \bar{B} \cdot C) \cdot (A + \bar{C})\} + \{(B \cdot C) \cdot (\bar{A} \cdot \bar{B} + \bar{B} \cdot C + C \cdot \bar{A})\}$$
$$= A \cdot B \cdot C + A \cdot \bar{B} \cdot C + \bar{A} \cdot \bar{B} \cdot \bar{C} + \bar{A} \cdot B \cdot C$$
$$= \bar{A} \cdot \bar{B} \cdot \bar{C} + A \cdot C + B \cdot C$$

FIG. 15C

| Present State C B A | Next State C B A |
|---|---|
| 1 1 1 | 1 1 0 |
| 1 1 0 | 1 0 1 |
| 1 0 1 | 1 0 0 |
| 1 0 0 | 0 1 1 |
| 0 1 1 | 0 1 0 |
| 0 1 0 | 0 0 1 |
| 0 0 1 | 0 0 0 |
| 0 0 0 | 1 1 1 |

FIG. 16B

S/A OUT = $(W+X) \cdot \bar{Y} \cdot \bar{Z} + (\bar{Y}+\bar{Z}) \cdot W \cdot X$ $W_A = R_H(1)$
$X_A = B \cdot C + C \cdot D + D \cdot B$
$Y_A = \bar{B} \cdot C + C \cdot D + D \cdot \bar{B}$
$Z_A = B \cdot \bar{C} + \bar{C} \cdot D + D \cdot B$
$A_{NEXT} = \{(1 + B \cdot C + C \cdot D + D \cdot B) \cdot \overline{(\bar{B} \cdot C + C \cdot D + D \cdot \bar{B})} \cdot \overline{(B \cdot \bar{C} + \bar{C} \cdot D + D \cdot B)}\}$
$\qquad + \{((\overline{\bar{B} \cdot C + C \cdot D + D \cdot \bar{B}}) + \overline{(B \cdot \bar{C} + \bar{C} \cdot D + D \cdot B)}) \cdot 1 \cdot (B \cdot C + C \cdot D + D \cdot B)\}$
$\qquad = \{(B \cdot \bar{C} + \bar{C} \cdot \bar{D} + \bar{D} \cdot B) \cdot (\bar{B} \cdot C + C \cdot \bar{D} + \bar{D} \cdot \bar{B})\} + \{B \cdot \bar{C} \cdot D + \bar{B} \cdot C \cdot D + B \cdot C \cdot \bar{D}\}$
$\qquad = \bar{B} \cdot \bar{C} \cdot \bar{D} + B \cdot C \cdot \bar{D} + \bar{B} \cdot C \cdot D + B \cdot \bar{C} \cdot D$ $W_B = \bar{A} \cdot \bar{C} + \bar{C} \cdot \bar{D} + \bar{D} \cdot \bar{A}$
$X_B = C \cdot D$
$Y_B = \bar{A} \cdot \bar{B}$
$Z_B = R_L(0)$
$B_{NEXT} = \{(\bar{A} \cdot \bar{C} + \bar{C} \cdot \bar{D} + \bar{D} \cdot \bar{A} + C \cdot D) \cdot (A + B) \cdot 1\}$
$\qquad + \{(A + B + 1) \cdot (\bar{A} \cdot \bar{C} + \bar{C} \cdot \bar{D} + \bar{D} \cdot \bar{A}) \cdot (C \cdot D)\}$
$\qquad = \{A \cdot \bar{C} \cdot \bar{D} + A \cdot C \cdot D + \bar{A} \cdot B \cdot \bar{C} + \bar{A} \cdot B \cdot \bar{D} + B \cdot C \cdot D + B \cdot \bar{C} \cdot \bar{D}\} + \{0\}$
$\qquad = A \cdot \bar{C} \cdot \bar{D} + A \cdot C \cdot D + \bar{A} \cdot B \cdot (\bar{C} + \bar{D}) + \bar{A} \cdot B \cdot C \cdot D + A \cdot B \cdot C \cdot D + \bar{A} \cdot B \cdot \bar{C} \cdot \bar{D} + A \cdot B \cdot \bar{C} \cdot \bar{D}$
$\qquad = A \cdot \bar{C} \cdot \bar{D} + A \cdot C \cdot D + \bar{A} \cdot B \cdot (\bar{C} + \bar{D} + C \cdot D + \bar{C} \cdot \bar{D}) + A \cdot B \cdot C \cdot D + A \cdot B \cdot \bar{C} \cdot \bar{D}$
$\qquad = A \cdot \bar{C} \cdot \bar{D} + A \cdot C \cdot D + \bar{A} \cdot B$ $W_C = \bar{A} \cdot B + B \cdot C + C \cdot \bar{A}$
$X_C = A \cdot C$
$Y_C = B \cdot D$
$Z_C = R_L(0)$
$C_{NEXT} = \{(\bar{A} \cdot B + B \cdot C + C \cdot \bar{A} + A \cdot C) \cdot (\bar{B} + \bar{D}) \cdot 1\}$
$\qquad + \{(\bar{B} + \bar{D} + 1) \cdot (\bar{A} \cdot B + B \cdot C + C \cdot \bar{A}) \cdot (A \cdot C)\}$
$\qquad = \{\bar{A} \cdot \bar{B} \cdot C + \bar{A} \cdot B \cdot \bar{D} + \bar{A} \cdot C \cdot \bar{D} + B \cdot C \cdot \bar{D} + A \cdot \bar{B} \cdot C + A \cdot C \cdot \bar{D}\} + \{A \cdot B \cdot C\}$
$\qquad = \{\bar{A} \cdot \bar{B} \cdot C + \bar{A} \cdot B \cdot \bar{D} + \bar{A} \cdot B \cdot C \cdot \bar{D} + \bar{A} \cdot B \cdot C \cdot \bar{D} + A \cdot B \cdot C \cdot \bar{D} + A \cdot \bar{B} \cdot C + A \cdot C \cdot \bar{D}\}$
$\qquad + \{A \cdot B \cdot C\}$
$\qquad = \bar{A} \cdot \bar{B} \cdot C + \bar{A} \cdot B \cdot \bar{D} + A \cdot C \cdot (B \cdot \bar{D} + \bar{B} + \bar{D} + B)$
$\qquad = \bar{A} \cdot \bar{B} \cdot C + \bar{A} \cdot B \cdot \bar{D} + A \cdot C$ $W_D = \bar{A} \cdot B + B \cdot C + C \cdot \bar{A}$
$X_D = \bar{B} + D$
$Y_D = \bar{A} + \bar{D}$
$Z_D = R_L(0)$
$D_{NEXT} = \{(\bar{A} \cdot B + B \cdot C + C \cdot \bar{A} + \bar{B} + D) \cdot (A \cdot D) \cdot 1\}$
$\qquad + \{(A \cdot D + 1) \cdot (\bar{A} \cdot B + B \cdot C + C \cdot \bar{A}) \cdot (\bar{B} + D)\}$
$\qquad = \{(B + C + \bar{B} + D) \cdot (A \cdot D) \cdot 1\} + \{\bar{A} \cdot \bar{B} \cdot C + \bar{A} \cdot B \cdot D + \bar{A} \cdot C \cdot D + B \cdot C \cdot D\}$
$\qquad = \{A \cdot D\} + \{\bar{A} \cdot \bar{B} \cdot C + \bar{A} \cdot B \cdot D + \bar{A} \cdot B \cdot C \cdot D + \bar{A} \cdot B \cdot C \cdot D + \bar{A} \cdot B \cdot C \cdot D + A \cdot B \cdot C \cdot D\}$
$\qquad = A \cdot D + \bar{A} \cdot \bar{B} \cdot C + \bar{A} \cdot B \cdot D$

FIG. 16C

| DCBA | D$_{NEXT}$ | C$_{NEXT}$ | B$_{NEXT}$ | A$_{NEXT}$ |
|------|------|------|------|------|
| 0000 | 0 | 0 | 0 | 1 |
| 0001 | 0 | 0 | 1 | 1 |
| 0011 | 0 | 0 | 1 | 0 |
| 0010 | 0 | 1 | 1 | 0 |
| 0110 | 0 | 1 | 1 | 1 |
| 0111 | 0 | 1 | 0 | 1 |
| 0101 | 0 | 1 | 0 | 0 |
| 0100 | 1 | 1 | 0 | 0 |
| 1100 | 1 | 1 | 0 | 1 |
| 1101 | 1 | 1 | 1 | 1 |
| 1111 | 1 | 1 | 1 | 0 |
| 1110 | 1 | 0 | 1 | 0 |
| 1010 | 1 | 0 | 1 | 1 |
| 1011 | 1 | 0 | 0 | 1 |
| 1001 | 1 | 0 | 0 | 0 |
| 1000 | 0 | 0 | 0 | 0 |

FIG. 17B

S/A OUT = $V_+ \cdot \overline{V}$ $A_{NEXT} = (\overline{A}+B) \cdot \overline{(A \cdot B)} = (\overline{A}+B) \cdot (\overline{A}+\overline{B}) = \overline{A}$ $B_{NEXT} = (A+B) \cdot \overline{(A \cdot B)} = (A+B) \cdot (\overline{A}+\overline{B}) = A \cdot \overline{B} + \overline{A} \cdot B = A \oplus B$ S/A OUT = $(W+X) \cdot \overline{Y} \cdot \overline{Z} + (\overline{Y}+\overline{Z}) \cdot W \cdot X$ $W_C = R_H(1)$ $X_C = A \cdot B + B \cdot C + C \cdot A$ $Y_C = A \cdot C$ $Z_C = B + \overline{C}$ $C_{NEXT} = (1 + A \cdot B + B \cdot C + C \cdot A) \cdot \overline{(A \cdot C)} \cdot \overline{(B+\overline{C})} + \{\overline{(A \cdot C)} + \overline{(B+\overline{C})}\} \cdot 1 \cdot (A \cdot B + B \cdot C + C \cdot A)$ $= (1 + A \cdot B + B \cdot C + C \cdot A) \cdot (\overline{A}+\overline{C}) \cdot \overline{B} \cdot C + (\overline{A}+\overline{C}+\overline{B} \cdot C) \cdot (A \cdot B + B \cdot C + C \cdot A)$ $= (1 + A \cdot B + B \cdot C + C \cdot A) \cdot \overline{A} \cdot \overline{B} \cdot C + \overline{A} \cdot B \cdot C + A \cdot B \cdot \overline{C} + A \cdot \overline{B} \cdot C$ $= \overline{A} \cdot \overline{B} \cdot C + \overline{A} \cdot B \cdot C + A \cdot B \cdot \overline{C} + A \cdot \overline{B} \cdot C$ $= A \cdot B \cdot \overline{C} + \overline{A} \cdot C + \overline{B} \cdot C$ $W_D = A \cdot B + B \cdot D + D \cdot A$ $X_D = \overline{B} \cdot \overline{C} + \overline{C} \cdot D + D \cdot \overline{B}$ $Y_D = A \cdot D$ $Z_D = \overline{C} \cdot \overline{D}$ $D_{NEXT} = \{(A \cdot B + B \cdot D + D \cdot A + \overline{B} \cdot \overline{C} + \overline{C} \cdot D + D \cdot \overline{B}) \cdot (\overline{A}+\overline{D}) \cdot (C+D)\}$
$\quad + \{(\overline{A}+\overline{D}+C+D) \cdot (A \cdot B + B \cdot D + D \cdot A) \cdot (\overline{B} \cdot \overline{C} + \overline{C} \cdot D + D \cdot \overline{B})\}$ $= \{(A \cdot B + \overline{C} + D) \cdot (\overline{A} \cdot C + \overline{A} \cdot D + C \cdot \overline{D})\}$
$\quad + \{A \cdot B \cdot \overline{C} \cdot D + B \cdot \overline{C} \cdot D + A \cdot \overline{B} \cdot \overline{C} \cdot D + A \cdot \overline{C} \cdot D + A \cdot \overline{B} \cdot D\}$ $= A \cdot B \cdot C \cdot \overline{D} + \overline{A} \cdot D + \overline{B} \cdot D + \overline{C} \cdot D$

FIG. 17C

| DCBA | D<sub>NEXT</sub> | C<sub>NEXT</sub> | B<sub>NEXT</sub> | A<sub>NEXT</sub> |
|---|---|---|---|---|
| 0000 | 0 | 0 | 0 | 1 |
| 0001 | 0 | 0 | 1 | 0 |
| 0010 | 0 | 0 | 1 | 1 |
| 0011 | 0 | 1 | 0 | 0 |
| 0100 | 0 | 1 | 0 | 1 |
| 0101 | 0 | 1 | 1 | 0 |
| 0110 | 0 | 1 | 1 | 1 |
| 0111 | 1 | 0 | 0 | 0 |
| 1000 | 1 | 0 | 0 | 1 |
| 1001 | 1 | 0 | 1 | 0 |
| 1010 | 1 | 0 | 1 | 1 |
| 1011 | 1 | 1 | 0 | 0 |
| 1100 | 1 | 1 | 0 | 1 |
| 1101 | 1 | 1 | 1 | 0 |
| 1110 | 1 | 1 | 1 | 1 |
| 1111 | 0 | 0 | 0 | 0 |

FIG. 18B $S/A\ OUT = V_+ \bullet \overline{V_-}$ $A_{NEXT} = (\overline{A} + B) \cdot \overline{(\overline{A} \cdot B)} = (\overline{A} + B) \cdot (A + \overline{B}) = \overline{A}$ $B_{NEXT} = (\overline{A} + B) \cdot \overline{(\overline{A} \cdot B)} = (\overline{A} + B) \cdot (A + \overline{B}) = A \cdot B + \overline{A} \cdot \overline{B} = \overline{A \oplus B}$ $\qquad S/A\ OUT = (W + X) \bullet \overline{Y} \bullet \overline{Z} + (\overline{Y} + \overline{Z}) \bullet W \bullet X$ $W_C = B \cdot C$ $X_C = \overline{A} \cdot \overline{B} + \overline{B} \cdot C + C \cdot \overline{A}$ $Y_C = R_L(0)$ $Z_C = \overline{A} \cdot C$ $C_{NEXT} = (B \cdot C + \overline{A} \cdot \overline{B} + \overline{B} \cdot C + C \cdot \overline{A}) \cdot (1) \cdot \overline{(\overline{A} \cdot C)} + (1 + \overline{\overline{A} \cdot C}) \cdot B \cdot C \cdot (\overline{A} \cdot \overline{B} + \overline{B} \cdot C + C \cdot \overline{A})$ $\qquad = (B \cdot C + \overline{A} \cdot \overline{B} + \overline{B} \cdot C + C \cdot \overline{A}) \cdot (A + \overline{C}) + (1 + A + \overline{C}) \cdot B \cdot C \cdot (\overline{A} \cdot \overline{B} + \overline{B} \cdot C + C \cdot \overline{A})$ $\qquad = (A \cdot B \cdot C + A \cdot \overline{B} \cdot C + \overline{A} \cdot \overline{B} \cdot \overline{C}) + (B \cdot C + A \cdot B \cdot C) \cdot (\overline{A} \cdot \overline{B} + \overline{B} \cdot C + C \cdot \overline{A})$ $\qquad = A \cdot B \cdot C + A \cdot \overline{B} \cdot C + \overline{A} \cdot \overline{B} \cdot \overline{C} + \overline{A} \cdot B \cdot C$ $\qquad = \overline{A} \cdot \overline{B} \cdot \overline{C} + A \cdot C + B \cdot C$ $W_D = A \cdot B + B \cdot D + D \cdot A$ $X_D = \overline{A} \cdot \overline{C} + \overline{C} \cdot D + D \cdot \overline{A}$ $Y_D = \overline{C} \cdot D$ $Z_D = B \cdot \overline{D}$ $D_{NEXT} = \{(A \cdot B + B \cdot D + D \cdot A + \overline{A} \cdot \overline{C} + \overline{C} \cdot D + D \cdot \overline{A}) \cdot (C + \overline{D}) \cdot (\overline{B} + D)\}$ $\qquad + \{(C + \overline{B} + D + \overline{D}) \cdot (A \cdot B + B \cdot D + D \cdot A) \cdot (\overline{A} \cdot \overline{C} + \overline{C} \cdot D + D \cdot \overline{A})\}$ $\qquad = \{(A \cdot B + \overline{A} \cdot \overline{C} + D) \cdot (C \cdot D + \overline{B} \cdot C + \overline{B} \cdot \overline{D})\}$ $\qquad + \{A \cdot B \cdot \overline{C} \cdot D + \overline{A} \cdot B \cdot \overline{C} \cdot D + B \cdot \overline{C} \cdot D + \overline{A} \cdot B \cdot D + A \cdot \overline{C} \cdot D\}$ $\qquad = \overline{A} \cdot \overline{B} \cdot \overline{C} \cdot \overline{D} + A \cdot D + B \cdot D + C \cdot D$

FIG. 18C

| DCBA | $D_{NEXT}$ | $C_{NEXT}$ | $B_{NEXT}$ | $A_{NEXT}$ |
|---|---|---|---|---|
| 1111 | 1 | 1 | 1 | 0 |
| 1110 | 1 | 1 | 0 | 1 |
| 1101 | 1 | 1 | 0 | 0 |
| 1100 | 1 | 0 | 1 | 1 |
| 1011 | 1 | 0 | 1 | 0 |
| 1010 | 1 | 0 | 0 | 1 |
| 1001 | 1 | 0 | 0 | 0 |
| 1000 | 0 | 1 | 1 | 1 |
| 0111 | 0 | 1 | 1 | 0 |
| 0110 | 0 | 1 | 0 | 1 |
| 0101 | 0 | 1 | 0 | 0 |
| 0100 | 0 | 0 | 1 | 1 |
| 0011 | 0 | 0 | 1 | 0 |
| 0010 | 0 | 0 | 0 | 1 |
| 0001 | 0 | 0 | 0 | 0 |
| 0000 | 1 | 1 | 1 | 1 |

FIG. 19A

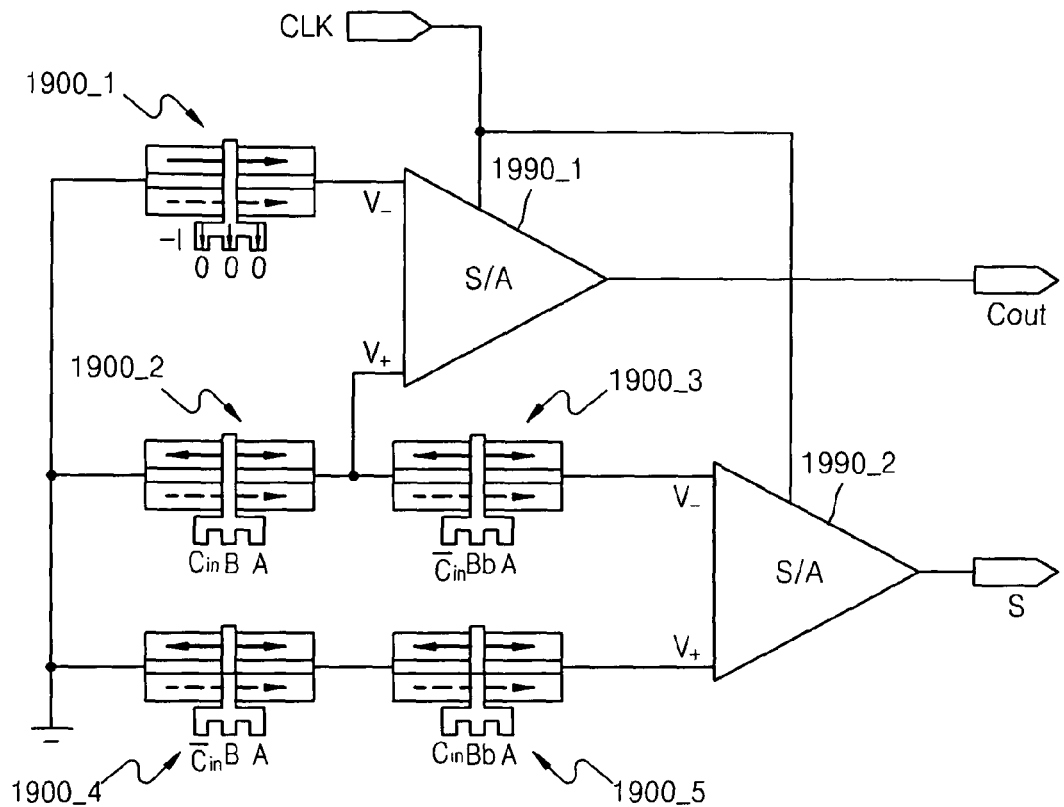

FIG. 19B $C_{out} = (A \cdot B + B \cdot C_{in} + C_{in} \cdot A) \cdot \overline{(0)} = A \cdot B + B \cdot C_{in} + C_{in} \cdot A$ $S = (A \cdot B + B \cdot \overline{C}_{in} + \overline{C}_{in} \cdot A) \cdot \overline{(A \cdot B + B \cdot C_{in} + C_{in} \cdot A)}$ $\quad + (A \cdot \overline{B} + \overline{B} \cdot C_{in} + C_{in} \cdot A) \cdot \overline{(A \cdot \overline{B} + \overline{B} \cdot \overline{C}_{in} + \overline{C}_{in} \cdot A)}$ $= (A \text{ XOR } B) \cdot \overline{C}_{in} + (A \text{ XNOR } B) \cdot C_{in}$ $= A \text{ XOR } B \text{ XOR } C_{in}$

FIG. 19C

| A B C$_{in}$ | S C$_{out}$ |
|---|---|
| 0 0 0 | 0 0 |
| 0 1 0 | 1 0 |
| 1 0 0 | 1 0 |
| 1 1 0 | 0 1 |
| 0 0 1 | 1 0 |
| 0 1 1 | 0 1 |
| 1 0 1 | 0 1 |
| 1 1 1 | 1 1 |

SEMICONDUCTOR MEMORY DEVICE AND MAGNETO-LOGIC CIRCUIT

CROSS-REFERENCE TO RELATED PATENT APPLICATION

This application claims the benefit of Korean Patent Application No. 10-2007-0022573, filed on Mar. 7, 2007, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a semiconductor memory device and a magneto-logic circuit which vary the direction of a magnetically induced current flowing through a magnetic induction layer according to a logical combination of a plurality of input values.

2. Description of the Related Art

A magnetic random access memory (RAM) has an operating speed higher than that of a static random access memory (SRAM), integration corresponding to that of a dynamic random access memory (DRAM), and nonvolatile memory characteristic corresponding to that of a flash memory. The magnetic RAM is a memory device that senses current variations according to magnetization directions of ferromagnetic thin films formed in a multi-layer structure, and reads and writes information using the current variations. The magnetic RAM has a high operating speed, low power consumption and high integration owing to characteristics of the ferromagnetic thin films and can perform a nonvolatile memory operation of a flash memory.

Magnetic RAMs use a giant magnetoresistive (GMR) phenomenon or a spin polarization magnetic permeation phenomenon which are generated because a spin largely affects the electron transfer phenomenon. Magnetic RAMs employing GMR use a difference between resistance when spin directions of two magnetic layers are identical to each other and resistance when the spin directions are different from each other. Magnetic RAMs employing the spin polarization magnetic permeation use the phenomenon that a case where spin directions of two magnetic layers are identical to each other has current permeation better than a case where the spin directions are different from each other.

SUMMARY OF THE INVENTION

The present invention provides a semiconductor memory device which varies the direction of a magnetically induced current flowing through a magnetic induction layer according to a combination of a plurality of input values.

The present invention also provides a magneto-logic circuit which varies the direction of a magnetically induced current flowing through a magnetic induction layer according to a combination of a plurality of input values.

According to an aspect of the present invention, there is provided a semiconductor memory device comprising a current driving circuit, a magnetic induction layer and a resistance-variable element. The current driving circuit receives a plurality of input values and outputs a magnetically induced current, wherein the direction of the magnetically induced current is changed according to a logical combination of logic states of the input values. The magnetic induction layer induces magnetism having a direction varying according to the direction of the magnetically induced current. The resistance-variable element has a resistance varying according to the direction of the magnetism induced by the magnetic induction layer.

The number of magnetic induction layer may be one.

BRIEF DESCRIPTION OF THE DRAWINGS

The above and other features and advantages of the present invention will become more apparent by describing in detail exemplary embodiments thereof with reference to the attached drawings in which:

FIGS. 3A through 3E are diagrams for explaining the semiconductor memory device illustrated in FIG. 2 according to an embodiment of the present invention;

FIGS. 11A and 11B are diagrams for explaining an XNOR logic circuit constructed using the semiconductor memory device illustrated in FIG. 3S and the sense amplifier illustrated in FIG. 9S;

FIGS. 12A, 12B and 12C are diagrams for explaining a logic circuit constructed using four resistance-variable elements the sense amplifier illustrated in FIG. 9A;

FIGS. 13A, 13B and 13C are diagrams for explaining a 3-bit gray counter according to an embodiment of the present invention;

FIGS. 14A, 14B and 14C are diagrams for explaining a 3-bit up-counter according to an embodiment of the present invention;

FIGS. 15A, 15B and 15C are diagrams for explaining a 3-bit down-counter according to an embodiment of the present invention;

FIGS. 16A, 16B and 16C are diagrams for explaining a 4-bit gray counter according to an embodiment of the present invention;

FIGS. 17A, 17B and 17C are, diagrams for explaining a 4-bit up-counter according to an embodiment of the present invention;

FIGS. 18A, 18B and 18C are diagrams for explaining a 4-bit down-counter according to an embodiment of the present invention; and FIGS. 19A, 19B and 19C are diagrams for explaining an adder according to an embodiment of the present invention.

DETAILED DESCRIPTION OF THE INVENTION

Figure 1:
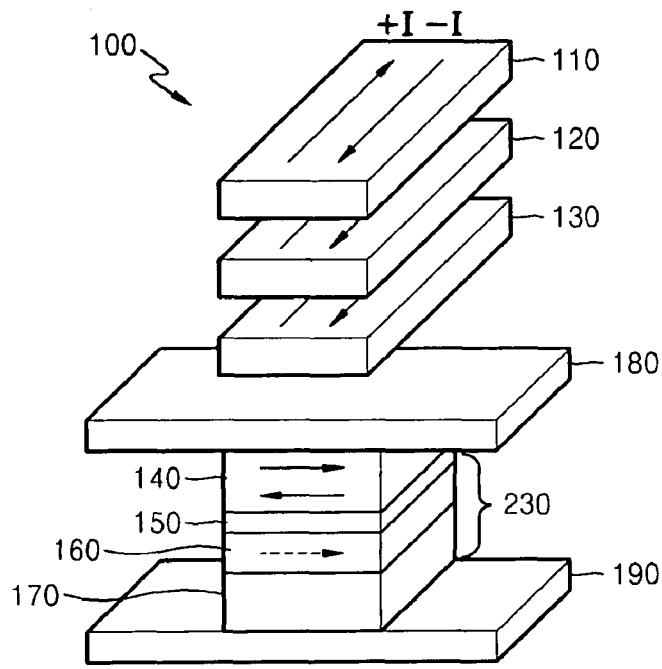
FIG. 1 illustrates a semiconductor memory device including three magnetic induction layers according to a comparative example.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

FIG. 1 illustrates a semiconductor memory device 100 including three magnetic induction layers 110, 120 and 130 according to a comparative example. Referring to FIG. 1, the semiconductor memory device 100 includes as many as magnetic induction layers 110, 120 and 130 as the number of input values and a resistance-variable element. The resistance-variable element includes a free magnetic layer 140 and a fixed magnetic layer 160.

In the semiconductor memory device 100, the direction of a magnetically induced current flowing through a single magnetic induction layer is determined according to a single input value. That is, magnetically induced currents respectively flow through the magnetic induction layers 110, 120 and 130 in different directions according to logic states of the input values. For example, a magnetically induced current flows in a +I direction in the magnetic induction layer 110 when an input value input to through the bottom of the magnetic induction layer 110 is 1 and the magnetically induced current flows in a −I direction in the magnetic induction layer 110 when the input value is 0.

Referring to the table illustrated in FIG. 1, when at least two input values are 0 and thus at least two magnetically induced currents flow in the −I direction, the free magnetic layer 140 is magnetized to the right so as to reduce the resistance of the resistance-variable element. On the other hand, when at least two input values are 1 and thus at least two magnetically induced currents flow in the +I direction, the free magnetic layer 140 is magnetized to the left so as to increase the resistance of the resistance-variable element. For example, when the input values are 0, 0 and 1, the magnetically induced current flows in the −I direction in the magnetic induction layers 110 and 120 and flows in the +I direction in the magnetic induction layer 130. Accordingly, the free magnetic layer 140 is magnetized to the right, and thus the resistance of the resistance-variable element decreases.

However, the semiconductor memory device 100 according to a comparative example must have as many magnetic induction layers as the number of input values. For example, the semiconductor memory device 100 must include the three magnetic induction layers 110, 120 and 130 in order to process the three input values. Accordingly, a complicated process is required to manufacture the semiconductor memory device 100. Furthermore, the semiconductor memory device 100 must have as many current driving circuits for flowing the magnetically induced current through the plurality of magnetic induction layers as the number of magnetic induction layers. Moreover, since the top magnetic induction layer 110 is distant from the free magnetic layer 140, the magnetic induction layer 110 requires a high current to change the magnetization direction of the free magnetic layer 140.

Figure 2:
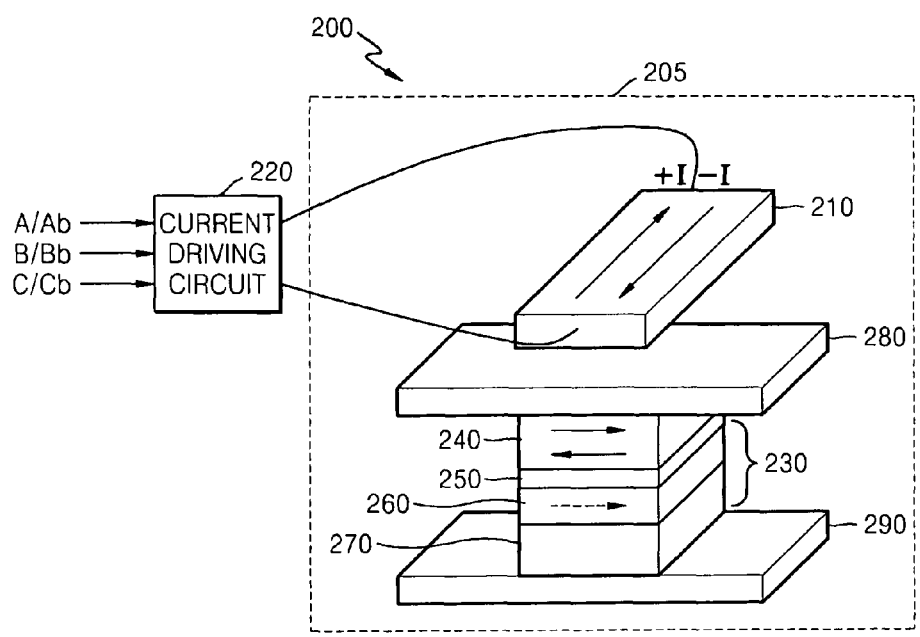
FIG. 2 illustrates a semiconductor memory device including a single magnetic induction layer according to an embodiment of the present invention.

FIG. 2 illustrates a semiconductor memory device 200 including a single magnetic induction layer 210 according to an embodiment of the present invention. Referring to FIG. 2, the semiconductor memory device 200 includes a current driving circuit 220, the magnetic induction layer 210, and a resistance-variable element 230. The current driving circuit 220 receives a plurality of input values A, B and C and changes the direction (+I or −I) of a magnetically induced current according to a logical combination of the input values A, B and C. The magnetic induction layer 210 induces magnetism in a direction varying according to the direction (+I or −I) of the magnetically induced current. The resistance-variable element 230 has a resistance varying according to the direction of the magnetism induced by the magnetic induction layer 210.

The number of magnetic induction layer 210 can be smaller than the number of input values A, B and C. Preferably, the number of magnetic induction layer 210 is one.

In the semiconductor memory device 100 according to a comparative example illustrated in FIG. 1, the direction of the magnetically induced current flowing through a single magnetic induction layer is determined by a single input value, and thus the semiconductor memory device 100 must include as many magnetic induction layers as the number of input values. However, in the semiconductor memory device 200 according to an embodiment of the present invention, the current driving circuit 220 logically combines the plurality of input values A, B and C and changes the direction (+I or −I) of the magnetically induced current flowing through the magnetic induction layer 210 according to the logical combination of the input values A, B and C. Accordingly, the semiconductor memory device 200 according to an embodiment of the present invention does not require to have as many magnetic induction layers as the number of input values. Particularly, the semiconductor memory device 200 according to an embodiment of the present invention can represent a logical combination of the plurality of input values A, B and C using only a single magnetic induction layer 210.

Referring back to FIG. 2, the current driving circuit 220 receives the three input values A, B and C and changes the direction (+I or −I) of the magnetically induced current according to a logical combination of the received input values A, B and C. The logical combination of the three input values A, B and C can correspond to the logical sum of the logical product of the first and second input values A and B, the logical product of the second and third input values B and C, and the logical product of the third and first input values C and A, that is, (A*B)+(B*C)+(C*A).

While FIG. 2 illustrates that the current driving circuit 220 changes the direction (+I or −I) of the magnetically induced current according to a logical combination of three input values, the number of input values is not limited to 3. For example, the current driving circuit 220 can receive two input values and change the direction of the magnetically induced current according to a logical combination of the two input values.

The resistance-variable element 230 can include a free magnetic layer 240 and a fixed magnetic layer 260. The free magnetic layer 240 has magnetism in a direction varying according to the direction of the magnetically induced current and the fixed magnetic layer 260 has magnetism in a fixed direction irrespective of the direction of the magnetically induced current. The resistance of the resistance-variable element 230 is determined according to the magnetic directions of the free magnetic layer 240 and the fixed magnetic layer 260. The resistance-variable element 230 can further include an insulating layer 250 disposed between the free magnetic layer 240 and the fixed magnetic layer 260.

The semiconductor memory device 200 according to an embodiment of the present invention can further include a pair of resistance measurement lines 280 and 290 for measuring the resistance of the resistance-variable element 230.

Figure 3A:
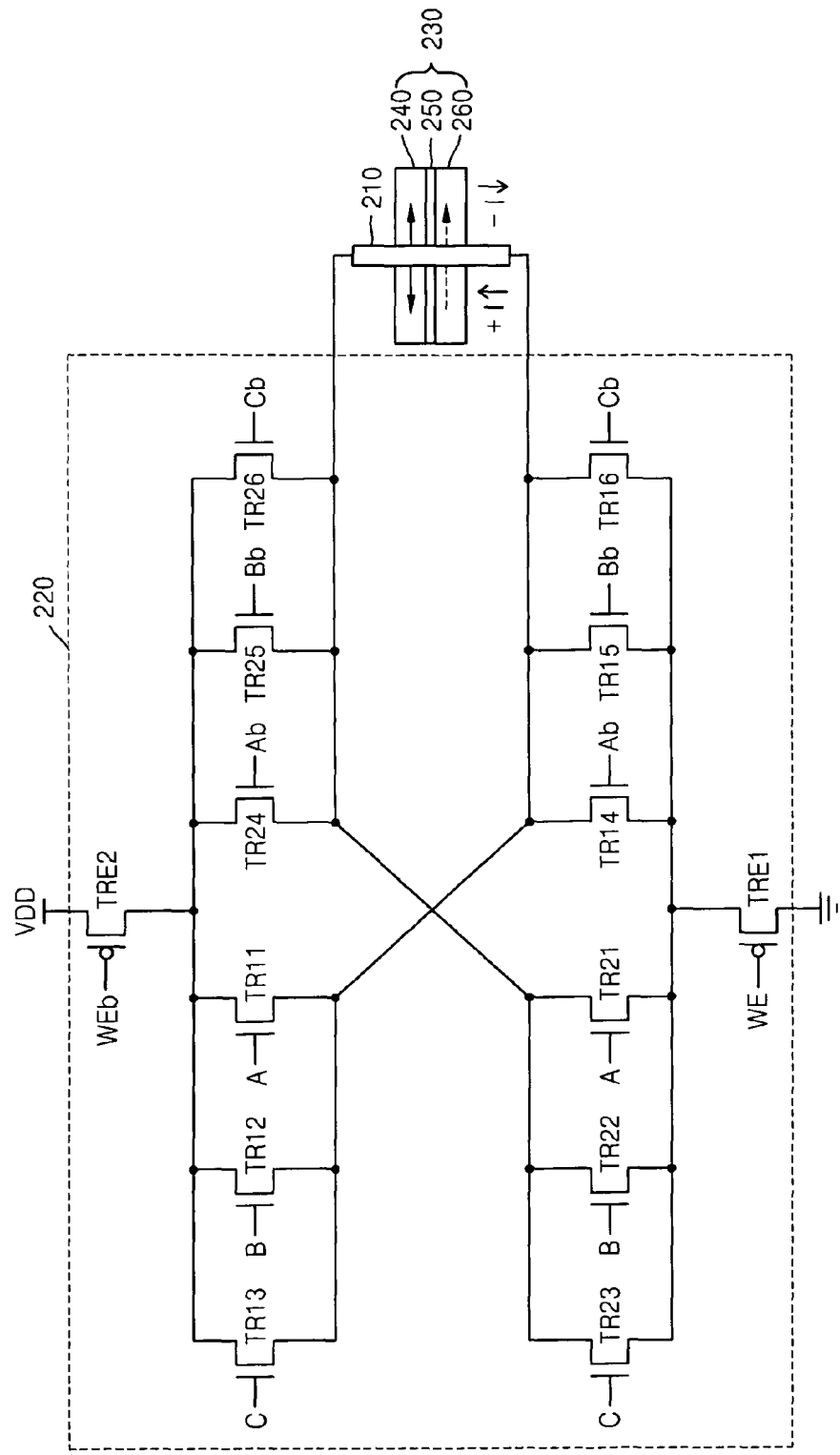

FIG. 3A illustrates a configuration of the semiconductor memory device illustrated in FIG. 2 according to an embodiment of the present invention. Referring to FIG. 3A, the current driving circuit 220 can include a plurality of transistors TR11 through TR16, TR21 through TR26, TRE1 and TRE2, which are turned on or turned off in response to the plurality of input values A, B and C or a plurality of inverted input values Ab, Bb and Cb. It is assumed that the same current I flows through the transistors TR11 through TR16 and TR21 through TR26 when the transistors TR11 through TR16 and TR21 through TR26 are tuned on.

The transistors TRE1 and TRE2 enable the current driving circuit 220 in response to enable signals WE and WEb.

The operation of the semiconductor memory device illustrated in FIG. 3A will now be explained.

The semiconductor memory device illustrated in FIG. 3A generates a current having a magnitude and a direction which vary according to the plurality of input values A, B and C. The generated current flows through the magnetic induction layer 210 and the resistance of the resistance-variable element 230 is determined by the direction of the current flowing through the magnetic induction layer 210.

For example, when the input values A, B and C are respectively 0, 0 and 0, the transistors TR11 and TR21 receiving the input value A, the transistors TR12 and TR22 receiving the input value B, and the transistors TR13 and TR23 receiving the input value C are turned off and the transistors TR14 and TR24 receiving the inverted input value Ab, the transistors TR15 and TR25 receiving the inverted input value Bb, and the transistors TR16 and TR26 receiving the inverted input value Cb are turned on. In this case, a current path is formed from a power supply voltage VDD to a ground voltage via the transistors TR24, TR25 and TR26, the magnetic induction layer 210 and the transistors TR14, TR15 and TR16. That is, the magnetic induction layer 210 receives a current from the transistors TR24, TR25 and TR26 and provides the current to the transistors TR14, TR15 and TR16. In this case, a current 3I flows through the current path. That is, when the input values A, B and C are respectively 0, 0 and 0, the current 3I flows in a −I direction through the magnetic induction layer 210. Accordingly, the resistance-variable element 230 has a low resistance.

When the input values A, B and C are respectively 0, 1 and 1, the transistors TR11 and TR21 receiving the input value A, the transistors TR15 and TR25 receiving the inverted input value Bb, and the transistors TR16 and TR26 receiving the inverted input value Cb are turned off and the transistors TR12 and TR22 receiving the input value B, the transistors TR13 and TR23 receiving the input value C, and the transistors TR14 and TR24 receiving the inverted input value Ab are turned on. In this case, a current 2I flows from the power supply voltage VDD through the two transistors TR12 and TR13. The current 2I is divided and respectively flows through the turned on transistor TR14 and the magnetic induction layer 210. That is, a current I flows through the magnetic induction layer 210 in a +I direction. In addition, a current I flows from the power supply voltage VDD through the transistor TR24. The current I flowing through the transistor TR24 is added to the current I flowing in the +I direction through the magnetic induction layer 210 to form a current 2I. The current 2I is divided by two and a current I respectively flows through the transistors TR22 and TR23. That is, when the input values A, B and C are respectively 0, 1 and 1, the current I flows in the +I direction through the magnetic induction layer 210, and thus the resistance-variable element 230 has a high resistance.

FIG. 3B illustrates resistances according to logical combinations of the input values of the semiconductor memory device illustrated in FIG. 3A. Referring to FIG. 3B, when the input values A, B and C are respectively 0, 1 and 0, a current −I flows through the magnetic induction layer 210 and the resistance-variable element 230 has a low resistance. When the input values A, B and C are respectively 1, 0, 1, a current +I flows through the magnetic induction layer 210 and the resistance-variable element 230 has a high resistance.

FIGS. 3C and 3D model an operation of determining the magnitude and the direction of the current flowing through the magnetic induction layer 210 according to the input values A, B and C in the semiconductor memory device illustrated in FIG. 3A. FIG. 3C illustrates that the input values A, B and C are input through the bottom of the magnetic induction layer 210. Referring to FIG. 3C, a current +I flows through the magnetic induction layer 210 when the input value A, for example, is 1 and a current −I flows through the magnetic induction layer 210 when the input value A is 0. FIG. 3D illustrates that the input values A, B and C are input through the surface of the magnetic induction layer 210. Referring to FIG. 3D, a current −I flows through the magnetic induction layer 210 when the input value A, for example, is 1 and a current +I flows through the magnetic induction layer 210 when the input value A is 0. The operation illustrated in FIG. 3D can be achieved by supplying the inverted input value Ab instead of the input value A to the transistors TR11 and TR12 illustrated in FIG. 3A, supplying the inverted input value Bb instead of the input value B to the transistors TR12 and TR22 illustrated in FIG. 3A, supplying the inverted input value Cb instead of the input value C to the transistors TR13 and TR23 illustrated in FIG. 3A, applying the input value A instead of the inverted input value Ab to the transistors TR14 and TR24 illustrated in FIG. 3A, applying the input value B instead of the inverted input value Bb to the transistors TR15 and TR25 illustrated in FIG. 3A, and applying the input value C instead of the inverted input value Cb to the transistors TR16 and TR26 illustrated in FIG. 3A.

Figure 3E:
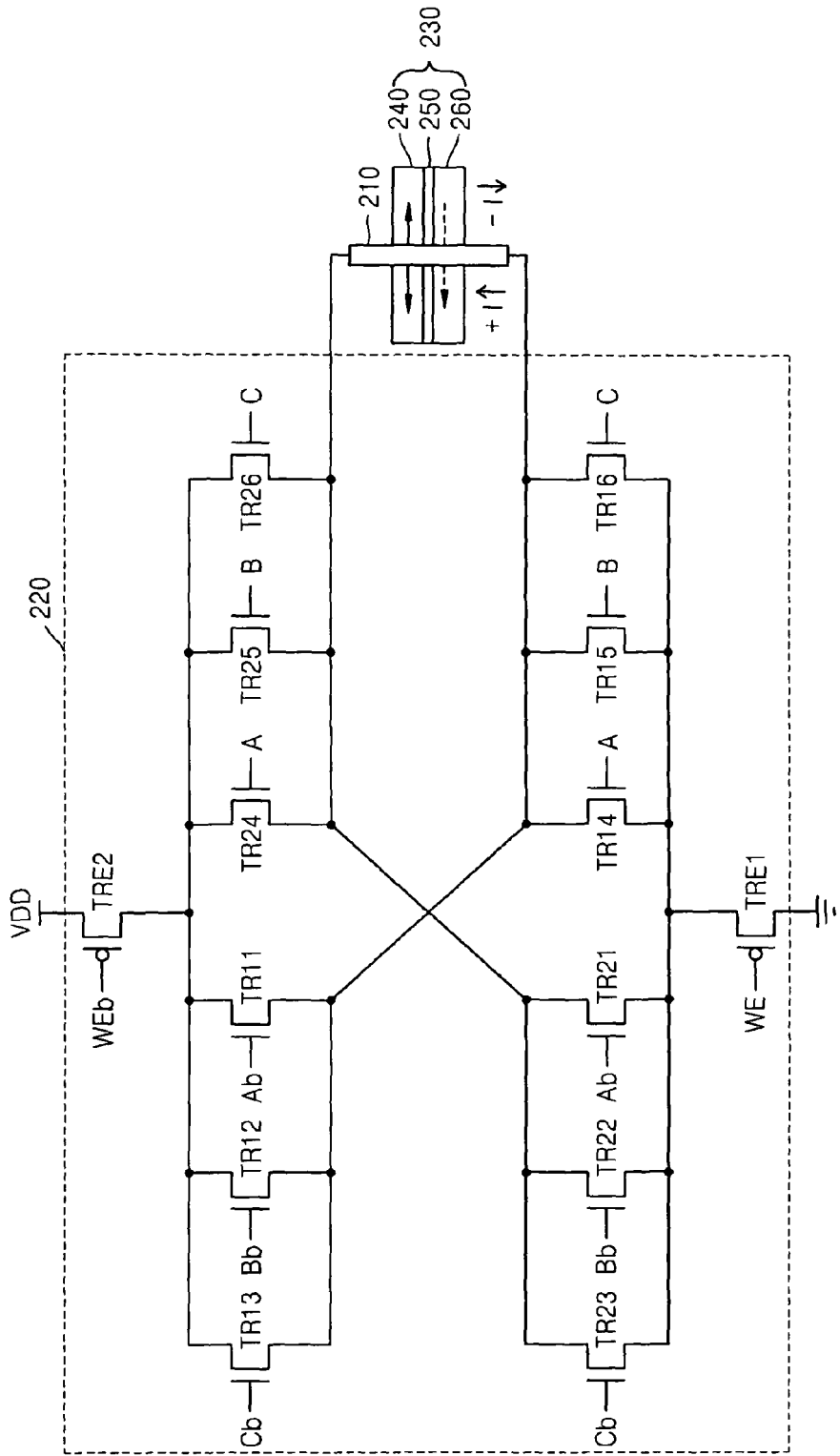

FIG. 3E illustrates a configuration of the semiconductor memory device illustrated in FIG. 2 according to another embodiment of the present invention. The semiconductor memory device illustrated in FIG. 3E includes the fixed magnetic layer 260 magnetized to the left. The inverted input value Ab is supplied to the transistors TR11 and TR21, the inverted input value Bb is supplied to the transistors TR12 and TR22, and the inverted input value Cb is applied to the transistors TR13 and TR23. In addition, the input value A is supplied to the transistors TR14 and TR24, the input value B is applied to the transistors TR15 and TR25, and the input value C is supplied to the transistors TR16 and TR26.

The semiconductor memory device illustrated in FIG. 3E performs the same logical operation as that of the semiconductor memory device illustrated in FIG. 3A using the fixed magnetic layer 260 magnetized in a direction opposite to the magnetization direction of the fixed magnetic layer of the semiconductor memory device illustrated in FIG. 3A.

Specifically, in the semiconductor memory device illustrated in FIG. 3E, a current −I flows in the magnetic induction layer 210 and the resistance-variable element 230 has a high resistance when at least two of the input values A, B and C are 1, and a current +I flows in the magnetic induction layer 210 and the resistance-variable element 230 has a low resistance when at least two of the input values A, B and C are 0. In the semiconductor memory device illustrated in FIG. 3A, the current +I flows in the magnetic induction layer 210 and the resistance-variable element 230 has a high resistance when at least two of the input values A, B and C are 1, and the current −I flows in the magnetic induction layer 210 and the resistance-variable element 230 has a low resistance when at least two of the input values A, B and C are 0.

That is, in both the semiconductor memory device illustrated in FIG. 3E and the semiconductor memory device illustrated in FIG. 3A, the resistance-variable element 230 has a high resistance when at least two of the input values A, B and C are 1 and has a low resistance when at least two of the input values A, B and C are 0. Accordingly, the semiconductor memory device illustrated in FIG. 3E and the semiconductor memory device illustrated in FIG. 3A perform the same logical operation by changing the transistors receiving the input values A, B and C and the transistors receiving the inverted input values Ab, Bb and Cb.

That is, the semiconductor memory device according to the present invention can perform the same logical operation when the fixed magnetic layer is magnetized to the left and when the fixed magnetic layer is magnetized to the right through a simple circuit modification. Accordingly, the semiconductor memory device according to the present invention will be explained on the basis of the case in which the fixed magnetic layer is magnetized to the right, and the explanation for the case in which the fixed magnetic layer is magnetized to the left will be omitted. However, those of ordinary skill in the art can realize a semiconductor memory device having a fixed magnetic layer magnetized to the left with reference to a semiconductor memory device having a fixed magnetic layer magnetized to the right.

Figure 4A:
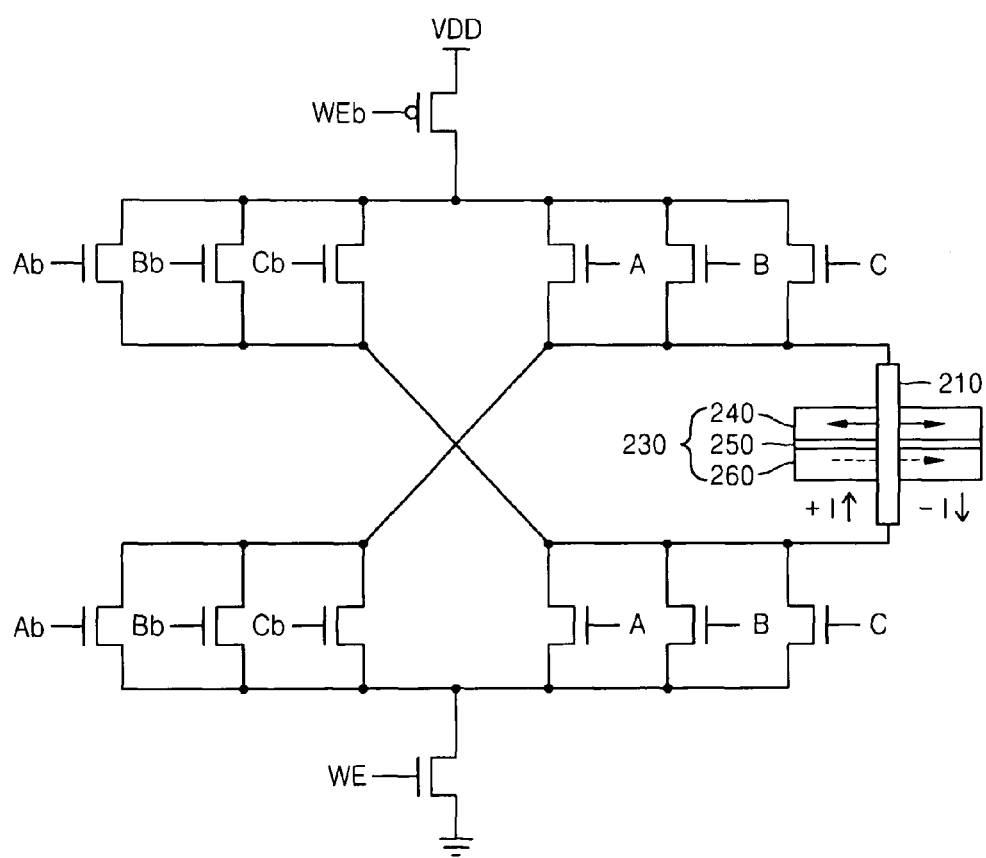
FIGS. 4A, 4B and 4C are diagrams for explaining the semiconductor memory device illustrated in FIG. 2 according to another embodiment of the present invention.
Figures 4B, 4C:
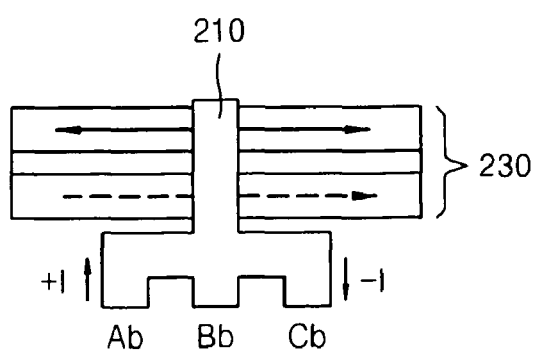

FIG. 4A illustrates a configuration of the semiconductor memory device illustrated in FIG. 2 according to another embodiment of the present invention, FIG. 4B illustrates resistances according to logical combinations of input values of the semiconductor memory device illustrated in FIG. 4A, and FIG. 4C models an operation of determining the magnitude and the direction of a current flowing in a magnetic induction layer 210 according to the input values in the semiconductor memory device illustrated in FIG. 4A. The structure and the operation of the semiconductor memory device illustrated in FIG. 4A correspond to those of the semiconductor memory device illustrated in FIG. 3A except that the input values input to the transistors are changed. Accordingly, detailed explanations of the semiconductor memory device illustrated in FIG. 4 are omitted.

The current driving circuit of the semiconductor memory device according to the present invention can fix one of the three input values and receive the remaining two input values. In this case, the current driving circuit can change the direction of a magnetically induced current according to a logical combination of the fixed input value and the received two input values. In this manner, the semiconductor memory device according to the present invention can be used as various logic gates including an AND gate, an OR gate, a NAND gate and a NOR gate.

Figure 5A:
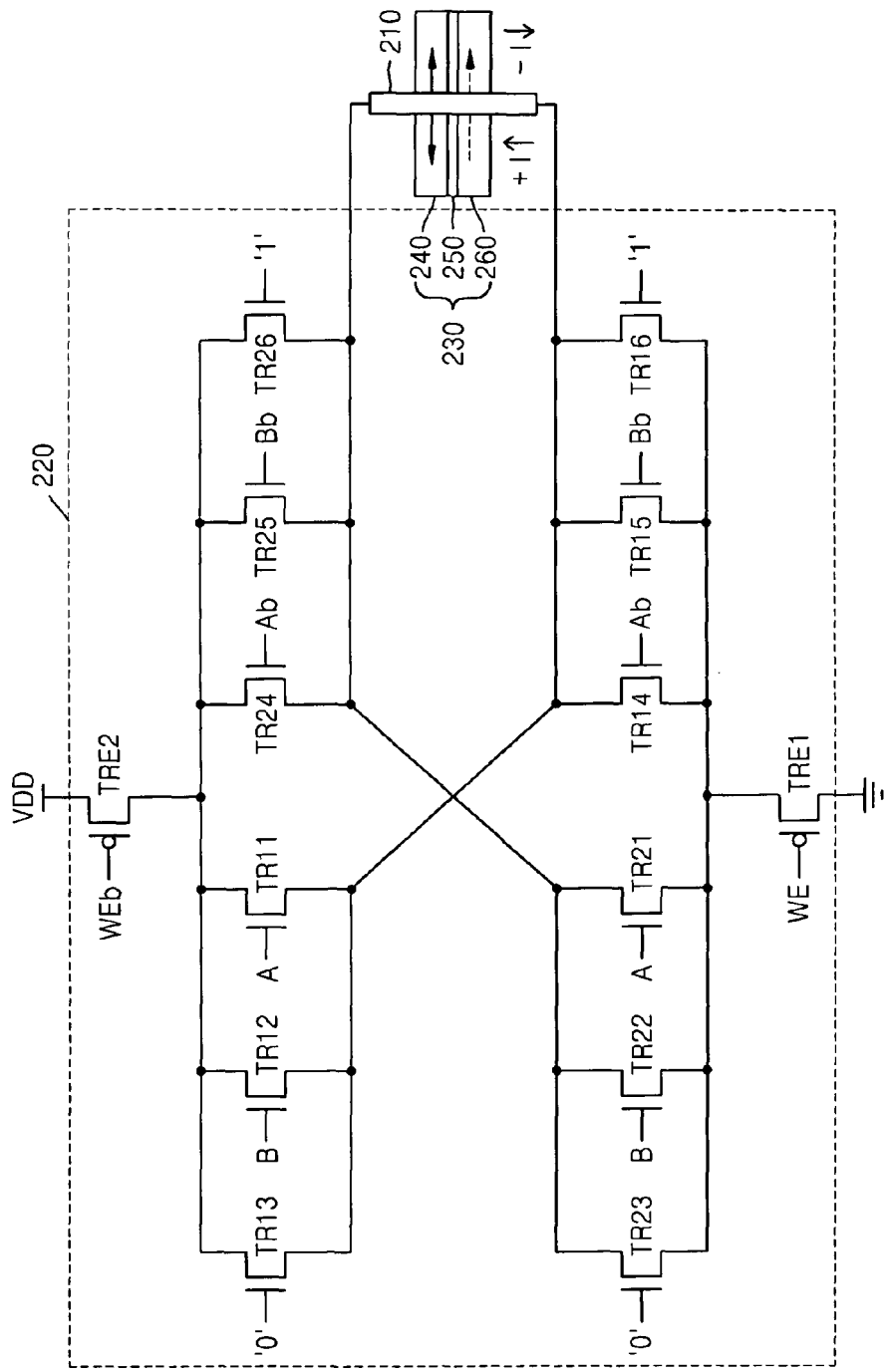
FIGS. 5A, 5B and 5C are diagrams for explaining the semiconductor memory device illustrated in FIG. 3A when used as an AND gate according to an embodiment of the present invention.

FIG. 5A illustrates the semiconductor memory device illustrated in FIG. 3A when used as an AND gate according to an embodiment of the present invention. Referring to FIG. 5A, 0 is input to the transistors TR13 and TR23 and 1 is input to the transistors TR16 and TR26. That is, the current driving circuit 220 fixes the input value C from among the three input values A, B and C to 0 or 1 and receives the remaining two input values A and B. FIG. 5A illustrates that the input value C is fixed to 0. Accordingly, the transistors TR13 and TR23 receiving the input value C fixed to 0 are turned off and the transistors TR16 and TR26 receiving the input value Cb fixed to 1 are turned on. A magnetically induced current −I flows in the magnetic induction layer 210 according to the fixed input value C.

Figures 5B, 5C:
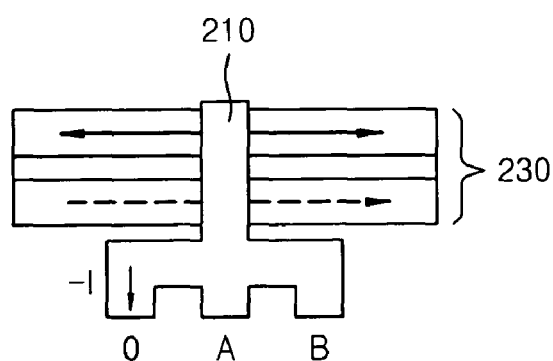

FIG. 5B illustrates resistances according to logical combinations of the input values A and B in the semiconductor memory device illustrated in FIG. 5A. When the input values A and B are both 1, a magnetically induced current +I flows in the magnetic induction layer 210, and thus the free magnetic layer 240 of the resistance-variable element 230 is magnetized to the left. In this case, the free magnetic layer 240 and the fixed magnetic layer 260 of the resistance-variable element 230 have different magnetic directions and the resistance of the resistance-variable element 230 increases. When the input values A and B are respectively 0 and 0, 0 and 1, or 1 and 0, a magnetically induced current −I flows in the magnetic induction layer 210, and thus the free magnetic layer 240 of the resistance-variable element 230 is magnetized to the right. In this case, the free magnetic layer 240 and the fixed magnetic layer 260 of the resistance-variable element 230 have the same magnetic direction and the resistance of the resistance-variable element 230 decreases. That is, the resistance of the resistance-variable element 230 increases when both the input values A and B are 1 and the resistance of the resistance-variable element 230 decreases when both the input value A and B are not 1. In this manner, the semiconductor memory device illustrated in FIG. 5A operates as an AND gate.

FIG. 5C models an operation of determining the magnitude and the direction of a current flowing in the magnetic induction layer 210 according to the input values in the semiconductor memory device illustrated in FIG. 5A. Referring to FIG. 5C, the input value C is fixed to 0, and thus a current −I flows in the magnetic induction layer 210. The direction of the current flowing in the magnetic induction layer 210 varies according to the input values A and B.

Figure 6A:
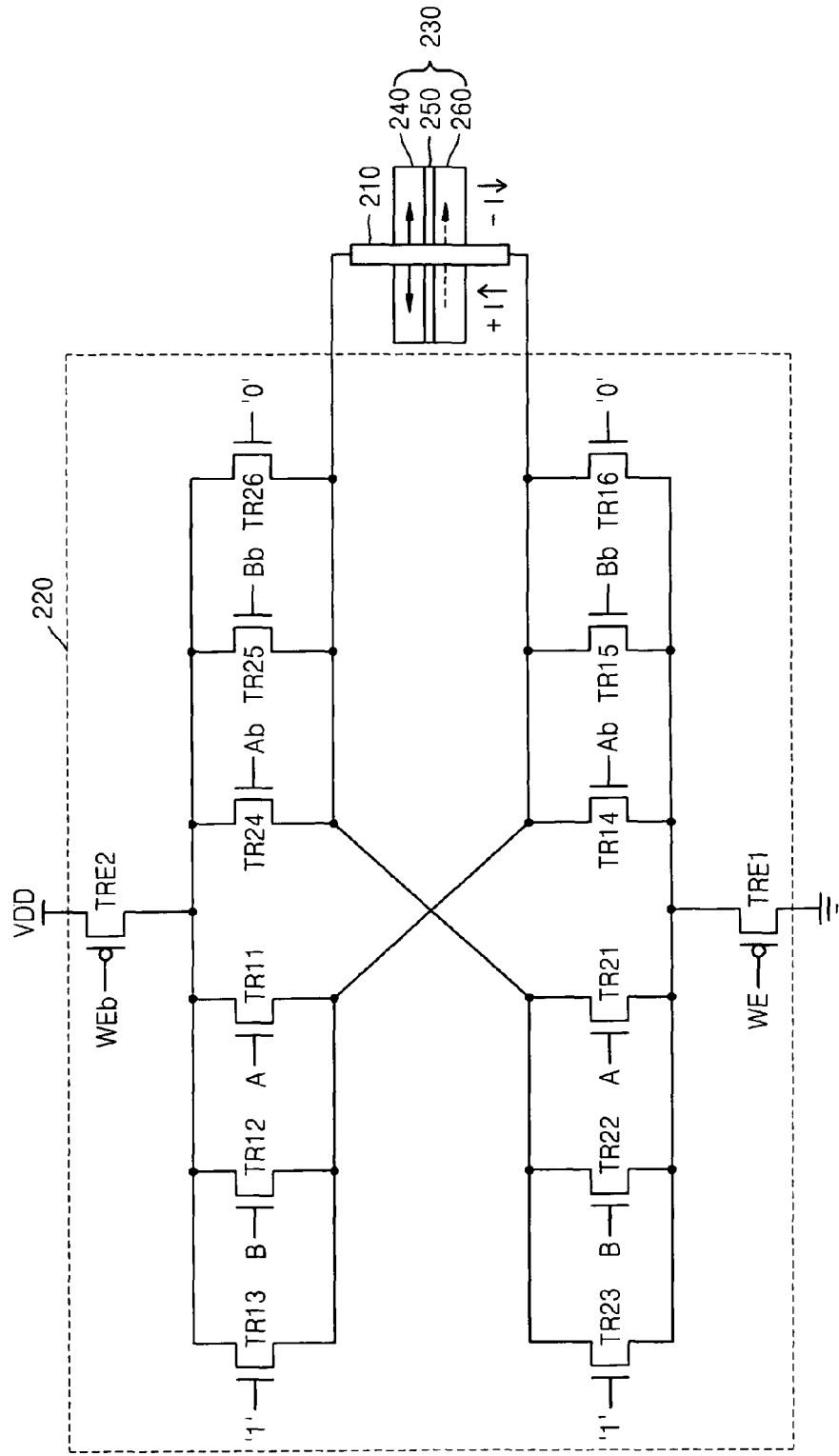
FIGS. 6A, 6B and 6C are diagrams for explaining the semiconductor memory device illustrated in FIG. 3A when used as an OR gate according to an embodiment of the present invention.

FIG. 6A illustrates the semiconductor memory device illustrated in FIG. 3A when used as an OR gate according to an embodiment of the present invention. Referring to FIG. 6A, 0 is input to the transistors TR16 and TR26 and 1 is input to the transistors TR13 and TR23. Accordingly, the transistors TR16 and TR26 are turned off irrespective of the input values A and B and the transistors TR13 and TR23 are turned on irrespective of the input values A and B.

Figures 6B, 6C:
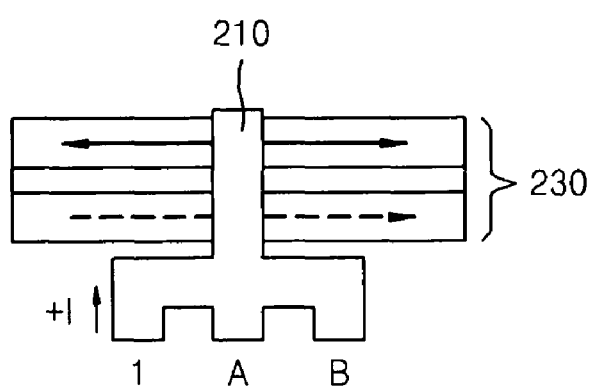

FIG. 6B illustrates resistances according to logical combinations of the input values A and B in the semiconductor memory device illustrated in FIG. 6A. The resistance of the resistance-variable element 230 decreases when the input values A and B are both 0 and increases when both the input values A and B are not 0. In this manner, the semiconductor memory device illustrated in FIG. 6A operates as an OR gate.

FIG. 6C models an operation of determining the magnitude and the direction of a current flowing in the magnetic induction layer 210 according to the input values in the semiconductor memory device illustrated in FIG. 6A.

Figure 7A:
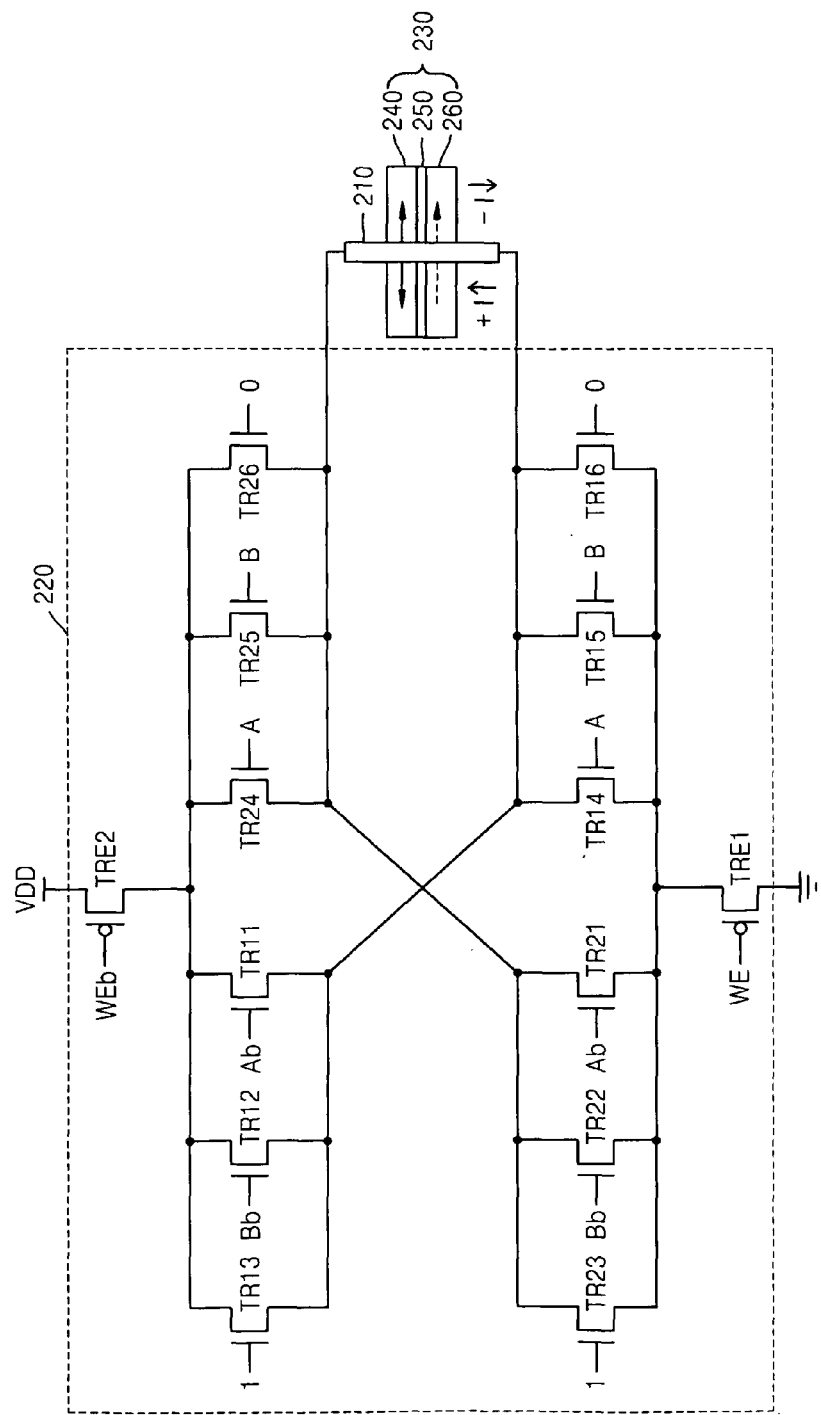
FIGS. 7A, 7B and 7C are diagrams for explaining the semiconductor memory device illustrated in FIG. 3A when used as a NAND gate according to an embodiment of the present invention.
Figures 7B, 7C:
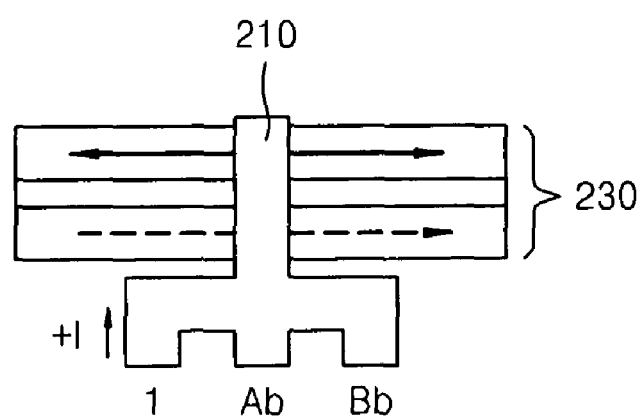

FIG. 7A illustrates the semiconductor memory device illustrated in FIG. 3A when used as a NAND gate according to an embodiment of the present invention, and FIG. 7B illustrates resistances according to logical combinations of the input values A and B in the semiconductor memory device illustrated in FIG. 7A. The resistance of the resistance-variable element 230 decreases when the input values A and B are both 1 and increases when both the input values A and B are not 1. In this manner, the semiconductor memory device illustrated in FIG. 7A operates as a NAND gate. FIG. 7C models an operation of determining the magnitude and the direction of a current flowing in the magnetic induction layer 210 according to the input values in the semiconductor memory device illustrated in FIG. 7A.

Figure 8A:
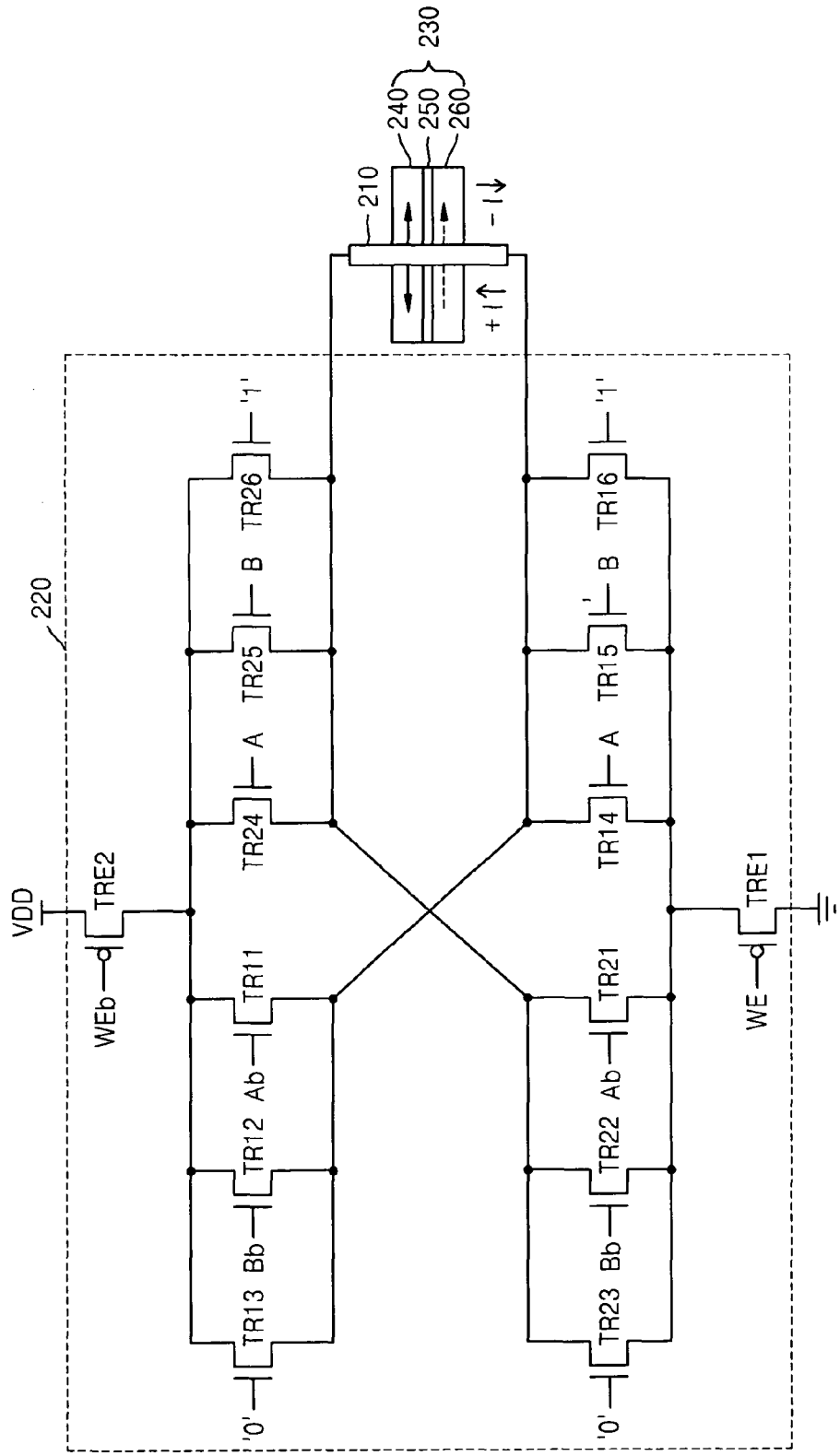
FIGS. 8A, 8B and 8C are diagrams for explaining the semiconductor memory device illustrated in FIG. 3A when used as a NOR gate according to an embodiment of the present invention.
Figures 8B, 8C:
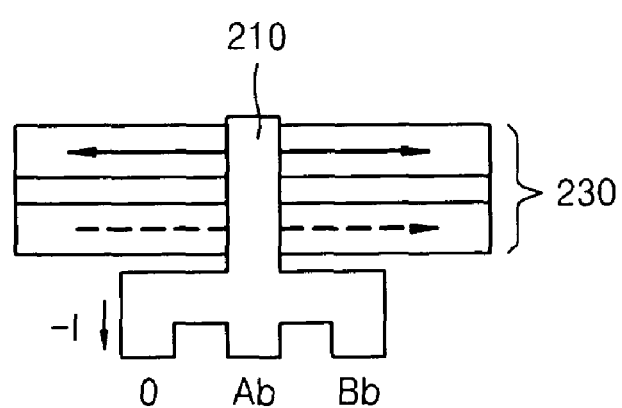

FIG. 8A illustrates the semiconductor memory device illustrated in FIG. 3A when used as a NOR gate according to an embodiment of the present invention, and FIG. 8B illustrates resistances according to logical combinations of the input values A and B in the semiconductor memory device illustrated in FIG. 8A. The resistance of the resistance-variable element 230 increases when the input values A and B are both 0 and decreases when both the input values A and B are not 0. In this manner, the semiconductor memory device illustrated in FIG. 8A operates as a NOR gate. FIG. 8C models an operation of determining the magnitude and the direction of a current flowing in the magnetic induction layer 210 according to the input values in the semiconductor memory device illustrated in FIG. 8A.

Figures 9A, 9B:
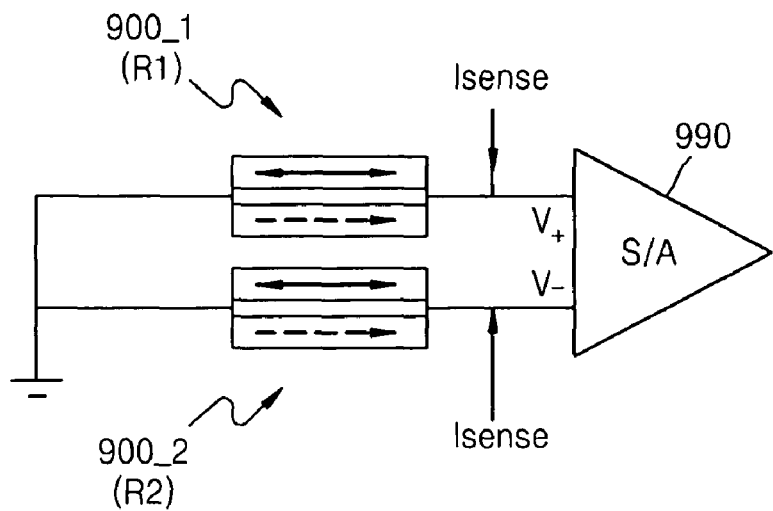
FIGS. 9A and 9B are diagrams for explaining the configuration and the operation of a sense amplifier according to an embodiment of the present invention.

FIG. 9A illustrates a configuration of a sense amplifier 990 according to an embodiment of the present invention, and FIG. 9B is a diagram for explaining the operation of the sense amplifier illustrated in FIG. 9A. Referring to FIGS. 9A and 9B, the sense amplifier 990 compares the resistance R1 of a first resistance-variable element 900_1 connected to a first terminal thereof to the resistance R2 of a second resistance-variable element 900_2 connected to a second terminal thereof. The sense amplifier 990 can output a logic high signal S/A OUT when the resistance R1 of the first resistance-variable element 900_1 is higher than the resistance R2 of the second resistance-variable element 900_2 and output a logic low signal S/A OUT when the resistance R1 of the first resistance-variable element 900_1 is lower than or identical to the resistance R2 of the second resistance-variable element 900_2. That is, the sense amplifier 990 can perform a logic AND operation on the resistance R1 of the first resistance-variable element 900_1 and the inverted value of the resistance R2 of the second resistance-variable element 900_2.

The sense amplifier 990 can compare the voltage V+ of the first terminal to the voltage V− of the second terminal using a sensing current Isense to compare the resistance R1 of the first resistance element 900_1 connected to the first terminal to the resistance R2 of the second resistance-variable element 900_2 connected to the second terminal. The sense amplifier 990 can perform a logic AND operation on the voltage V+ of the first terminal and the inverted value of the voltage V− of the second terminal. Preferably, an offset voltage of the second terminal of the sense amplifier 990 is higher than 0 and lower than a value obtained by multiplying a difference between a high resistance and a low resistance of resistance-variable elements that can be connected to the terminals of the sense amplifier by the sensing current Isense.

Figures 10A, 10B:
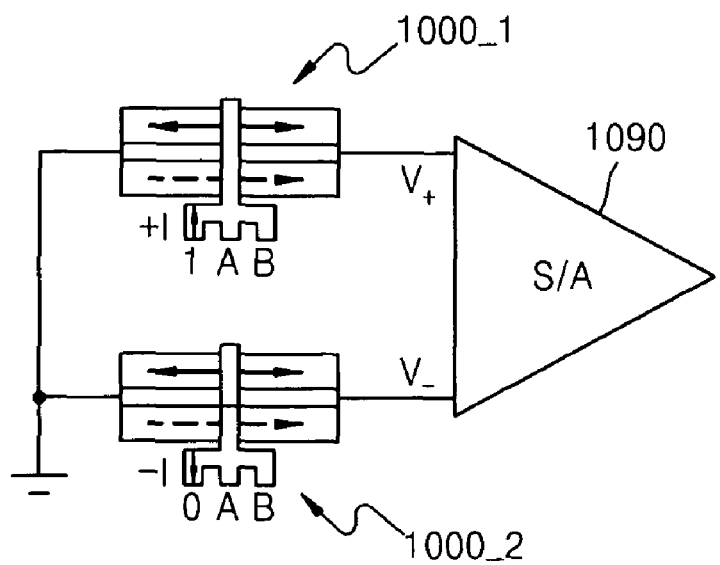
FIGS. 10A and 10B are diagrams for explaining an XOR logic circuit constructed using the semiconductor memory device illustrated in FIG. 3A and the sense amplifier illustrated in FIG. 9A.

FIG. 10A illustrates an XOR logic circuit constructed using the semiconductor memory device illustrated in FIG. 3A and the sense amplifier illustrated in FIG. 9A. Referring to FIG. 10A, a first resistance-variable element 1000_1 has the same structure as the resistance-variable element 230 of the OR gate illustrated in FIG. 6A and a second resistance-variable element 1000_2 has the same structure as the resistance-variable element 230 of the AND gate illustrated in FIG. 5A. As described above, a sense amplifier 1090 performs a logic AND operation on the resistance of the first resistance-variable element 1000_1 connected to a first terminal thereof and the inverted value of the resistance of the second resistance-variable element 1000_2 connected to a second terminal thereof. As illustrated in FIG. 10B, the output of the sense amplifier 1090 corresponds to the result of a logic XOR operation performed on input values A and B.

FIG. 11A illustrates an XNOR logic circuit constructed using the semiconductor memory device illustrated in FIG. 3A and the sense amplifier illustrated in FIG. 9A. Referring to FIG. 11A, a first resistance-variable element 1100_1 has the same structure as the resistance-variable element 230 illustrated in FIG. 6A except that the inverted input value Ab instead of the input value A is supplied to the first resistance-variable element 1100_1, and a second resistance-variable element 1100_2 has the same structure as the resistance-variable element 230 illustrated in FIG. 5A except that inverted input value Ab instead of the input value A is supplied to the second resistance-variable element 1100_2. As described above, a sense amplifier 1190 performs a logic AND operation on the resistance of the first resistance-variable element 1100_1 connected to a first terminal thereof and the inverted value of the resistance of the second resistance-variable element 1100_2 connected to a second terminal thereof. As illustrated in FIG. 11B, the output of the sense amplifier 1190 corresponds to the result of a logic XNOR operation performed on input values A and B.

FIGS. 12A, 12B and 12C are diagrams for explaining a logic circuit constructed using four resistance-variable elements 1200_1, 1200_2, 1200_3 and 1200_4 and the sense amplifier illustrated in FIG. 9A. In FIGS. 12A, 12B and 12C, logic states of resistances of the four resistance-variable elements 1200_1, 1200_2, 1200_3 and 1200_4 are denoted as W, X, Y and Z. The logic circuit performs a logic operation represented by a logical expression illustrated in FIG. 12B and outputs a logic operation result illustrated in FIG. 12C.

Figure 13A:
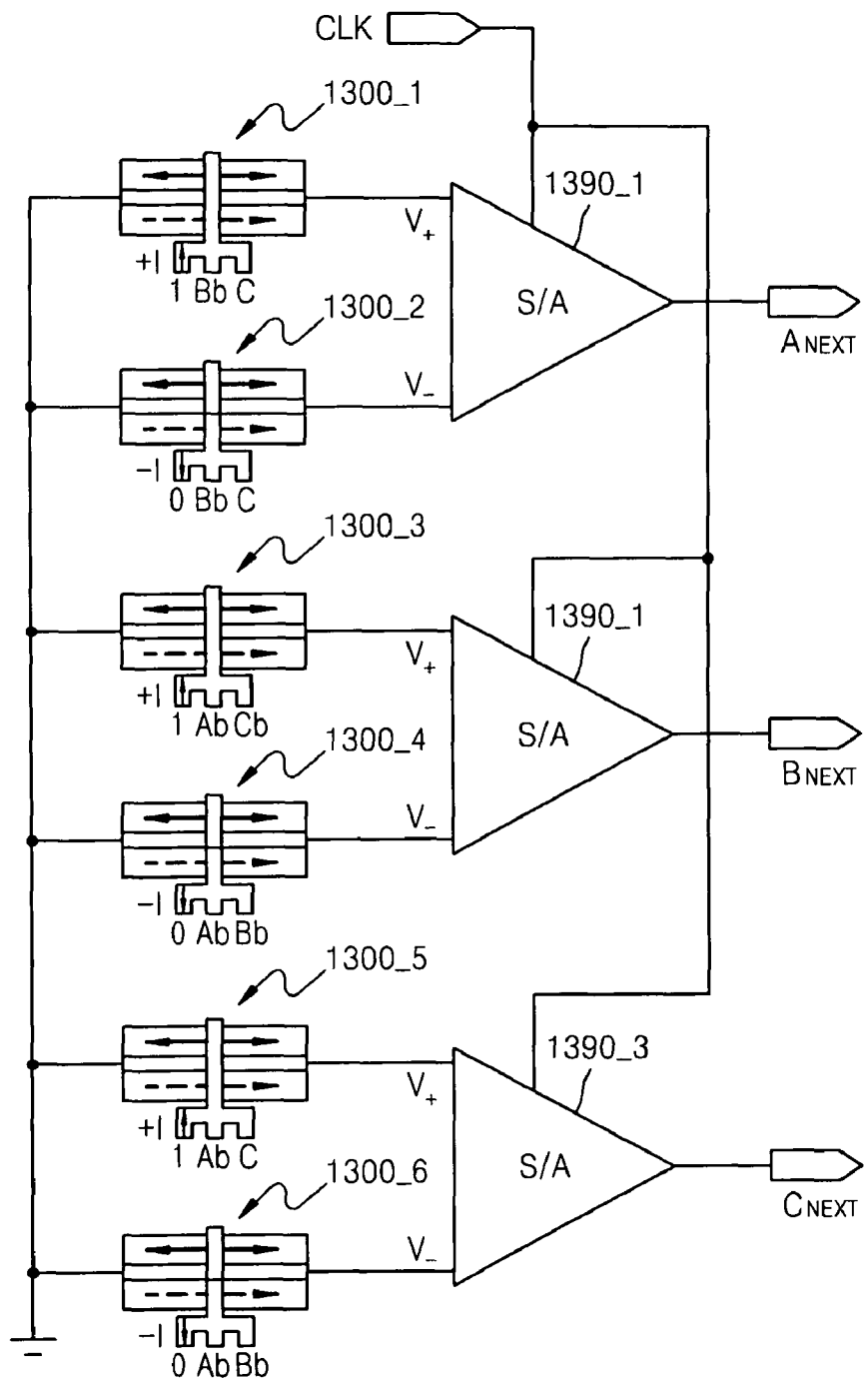

FIG. 13A illustrates a configuration of a 3-bit gray counter according to an embodiment of the present invention, and FIG. 13B illustrates logical expressions representing the operation of the 3-bit gray counter illustrated in FIG. 13A.

Referring to FIGS. 13A and 13B, a first resistance-variable element 1300_1 and a second resistance-variable element 1300_2 have the same structure as the resistance-variable elements 1100_1 and 1100_2 illustrated in FIG. 11A except that the inverted input value Bb instead of the inverted input value Ab is supplied and the input value C instead of the input value B is supplied. Accordingly, the first resistance-variable element 1300_1 and the second resistance-variable element 1300_2 perform a logic XNOR operation on the input values B and C.

A third resistance-variable element 1300_3 has the same structure as the resistance-variable element illustrated in FIG. 7A 230 except that the inverted input value Cb instead of the inverted input value Bb is supplied, and thus the third resistance-variable element 1300_3 performs a logic NAND operation on the input values A and C. A fourth resistance-variable element 1300_4 has the same structure as the resistance-variable element 230 illustrated in FIG. 8A, and thus the fourth resistance-variable element 1300_4 performs a logic NOR operation on the input values A and B. A second sense amplifier 1390_2 carries out a logic AND operation on the result of the logic NAND operation performed by the third resistance-variable element 1300_3 connected to a first terminal thereof and the inverted value of the result of the logic NOR operation performed by the fourth resistance-variable element 1300_4 connected to a second terminal thereof. The output of the second sense amplifier 1390_2 corresponds to $B_{NEXT}$ in the logical expressions of FIG. 13B.

A fifth resistance-variable element 1300_5 has the same structure as the resistance-variable element 230 illustrated in FIG. 6A except that the inverted input value Ab instead of the input value A is supplied and the input value C instead of the input value B is supplied. Accordingly, the fifth resistance-variable element 1300_5 performs a logic OR operation on the inverted input value Ab and the input value C. A sixth resistance-variable element 1300_6 has the same structure as the resistance-variable element 230 illustrated in FIG. 8A. Accordingly, the sixth resistance-variable element 1300_6 performs a logic NOR operation on the input value A and the input value B.

A third sense amplifier 1390_3 carries out a logic AND operation on the result of the logic AND operation performed by the fifth resistance-variable element 1300_5 connected to a first terminal thereof and the inverted value of the result of the logic NOR operation performed by the sixth resistance-variable element 1300_6 connected to a second terminal thereof. The output of the third sense amplifier 1390_3 corresponds to $C_{NEXT}$ in the logical expressions of FIG. 13B.

FIG. 13C illustrates the outputs of the first, second and third sense amplifiers 1390_1, 1390_2 and 1390_3 in response to the three input values A, B and C. It can be known from FIG. 13C that the logic circuit illustrated in FIG. 13A performs a 3-bit gray counting operation.

Figure 14A:
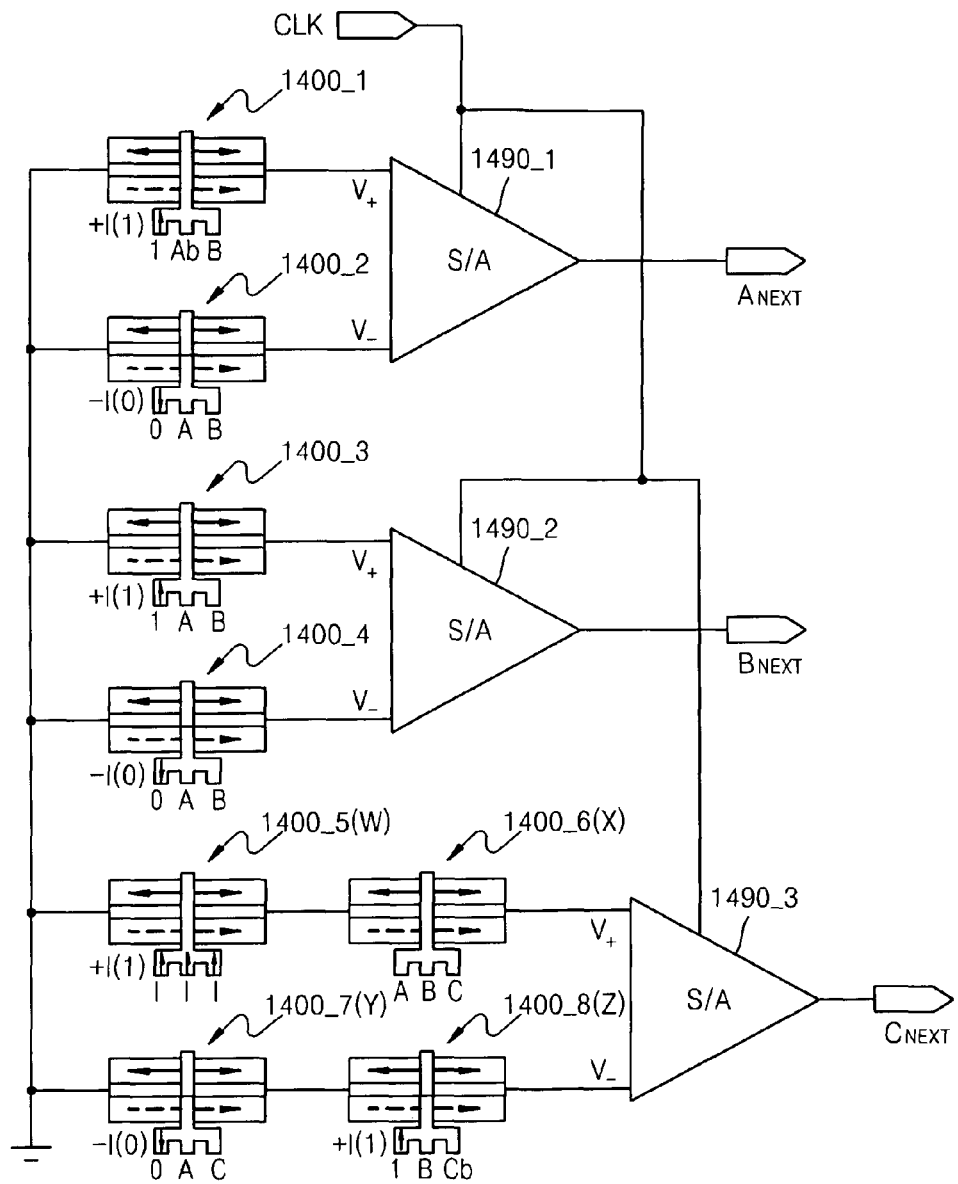

FIG. 14A illustrates a configuration of a 3-bit up-counter according to an embodiment of the present invention, and FIG. 13B illustrates logical expressions representing the operation of the 3-bit up-counter illustrated in FIG. 14A. Referring to FIGS. 14A and 14B, a first resistance-variable element 1400_1 has the same structure as the resistance-variable element 230 illustrated in FIG. 6A except that the inverted input value Ab instead of the input value A is supplied. Accordingly, the first resistance-variable element 1400_1 performs a logic OR operation on the inverted input value Ab and the input value B. A second resistance-variable element 1400_2 has the same structure as the resistance-variable element 230 illustrated in FIG. 5A, and thus the second resistance-variable element 1400_2 performs a logic AND operation on the input values A and B. A first sense amplifier 1490_1 carries out a logic AND operation on the result of the logic OR operation performed by the first resistance-variable element 1400_1 connected to a first terminal thereof and the inverted value of the result of the logic AND operation performed by the second resistance-variable element 1400_2 connected to a second terminal thereof. The output of the first sense amplifier 1490_1 corresponds to $A_{NEXT}$ in the logical expressions of FIG. 14B.

A third resistance-variable element 1400_3 and a fourth resistance-variable element 1400_4 have the same structure as the resistance-variable elements 1000_1 and 1000_2 illustrated in FIG. 10A. Accordingly, the third and fourth resistance-variable elements 1400_3 and 1400_4 perform a logic XOR operation on the input values A and B.

A fifth resistance-variable element 1400_5 has a fixed high resistance. That is, the logic operation result W of the fifth resistance-variable element 1400_5 is 1. A sixth resistance-variable element 1400_6 has the same structure as the resistance-variable element 230 illustrated in FIG. 3A. That is, the logic operation result X of the sixth resistance-variable element 1400_6 corresponds to (A*B)+(B*C)+(C*A). A seventh resistance-variable element 1400_7 has the same structure as the resistance-variable element 230 illustrated in FIG. 5A except that the input value C instead of the input value B is supplied, and thus the logic operation result Y of the seventh resistance-variable element 1400_7 corresponds to A*C. An eighth resistance-variable element 1400_8 has the same structure as the resistance-variable element illustrated in FIG. 6A except that the inverted input value Cb instead of the input value A is supplied, and thus the logic operation result Z of the eighth resistance-variable element 1400_8 corresponds to B+Cb.

When the logic operation results of the fifth, sixth, seventh and eighth resistance-variable elements 1400_5, 1400_6, 1400_7 and 1400_8 are applied to the logic gate illustrated in FIG. 12A, the output of a third sense amplifier 1490_3 becomes $C_{NEXT}$ in the logical expression of FIG. 14B.

FIG. 14C illustrates the outputs of the first, second and third sense amplifiers 1490_1, 1490_2 and 1390_3 in response to the three input values A, B and C. It can be known from FIG. 14C that the logic circuit illustrated in FIG. 14A performs a 3-bit up-counting operation.

Figure 15A:
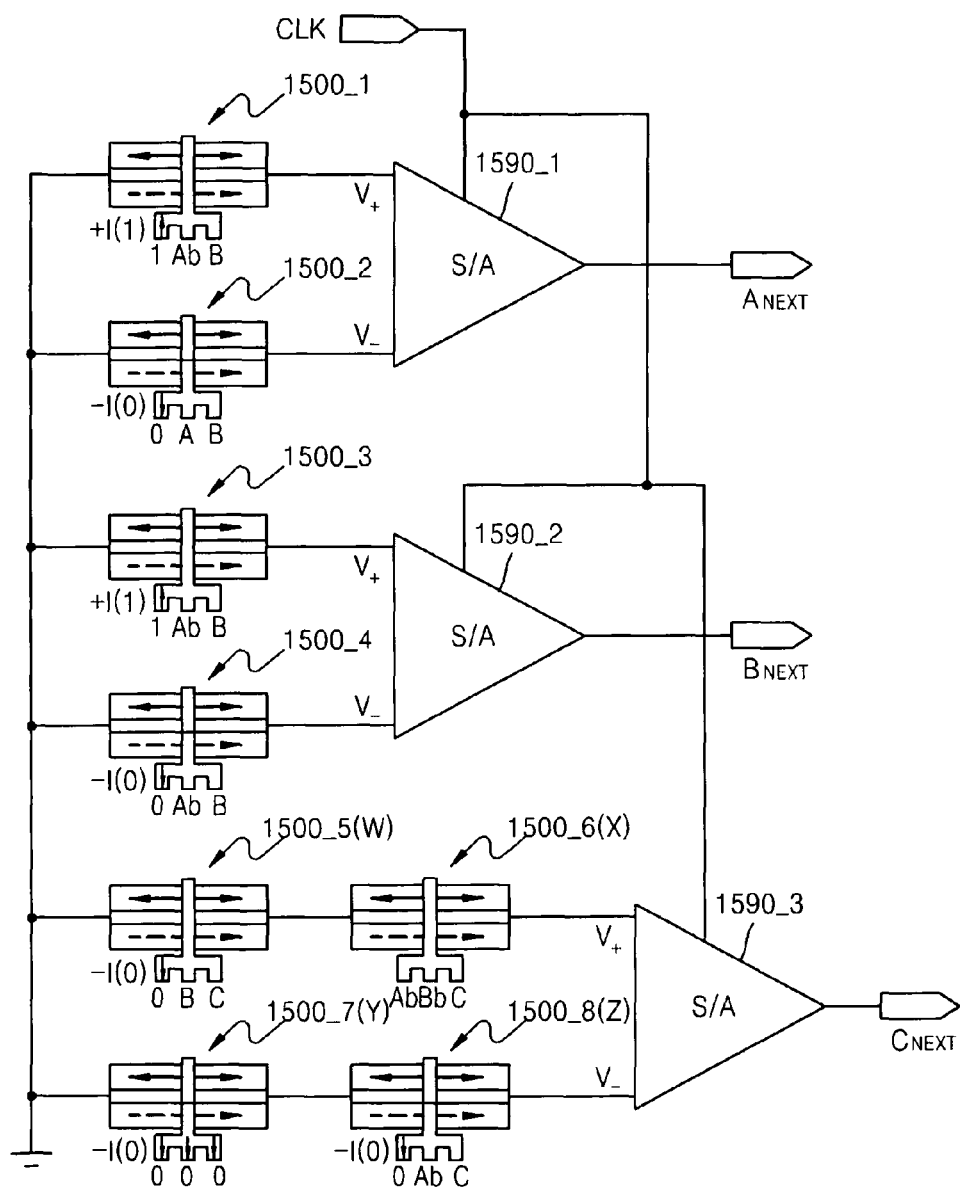

FIG. 15A illustrates a configuration of a 3-bit down-counter according to an embodiment of the present invention, and FIG. 15B illustrates logical expressions representing the operation of the 3-bit down-counter illustrated in FIG. 15A. Referring to FIGS. 15A and 15B; a first resistance-variable element 1500_1, a second resistance-variable element 1500_2 and a first sense amplifier 1590_1 respectively have the same structures as the first resistance-variable element 1400_1, the second resistance-variable element 1400_2 and the first sense amplifier 1490_1, and thus the output of the first sense amplifier 1590_1 corresponds to $A_{NEXT}$ in the logical expressions of FIG. 15B.

A third resistance-variable element 1500_3 and a fourth resistance-variable element 1500_4 have the same structure as the resistance-variable elements 1100_1 and 1100_2 illustrated in FIG. 11A. Accordingly, the third and fourth resistance-variable elements 1500_3 and 1500_4 perform a logic XNOR operation on the input values A and B.

A fifth resistance-variable element 1500_5 has the same structure as the resistance-variable element 230 illustrated in FIG. 5A except that the input value C instead of the input value A is supplied, and thus the logic operation result W of the fifth resistance-variable element 1500_5 corresponds to B*C. A sixth resistance-variable element 1500_6 has the same structure as the resistance-variable element illustrated in FIG. 4A except that the input value C instead of the inverted input value Cb is supplied. That is, the logic operation result X of the sixth resistance-variable element 1500_6 correspond to (Ab*Bb)+(Bb*C)+(C*Ab). A seventh resistance-variable element 1500_7 has a fixed low resistance. That is, the logic operation result X of the seventh resistance-variable element 1500_7 is 0. An eighth resistance-variable element 1500_8 has the same structure as the resistance-variable element 230 illustrated in FIG. 5A except that the inverted input value Ab instead of the input value A is supplied and the input value C instead of the input value B is supplied, and thus the logic operation result Z of the eighth resistance-variable element 1500_8 corresponds to Ab*C.

When the logic operation results of the fifth, sixth, seventh and eighth resistance-variable elements 1500_5, 1500_6, 1500_7 and 1500_8 are applied to the logic gate illustrated in FIG. 12A, the output of a third sense amplifier 1590_3 becomes $C_{NEXT}$ in the logical expressions of FIG. 15B.

FIG. 15C illustrates the outputs of the first, second and third sense amplifiers 1590_1, 1590_2 and 1590_3 in response to the three input values A, B and C. It can be known from FIG. 15C that the logic circuit illustrated in FIG. 15A performs a 3-bit down-counting operation.

Figure 16A:
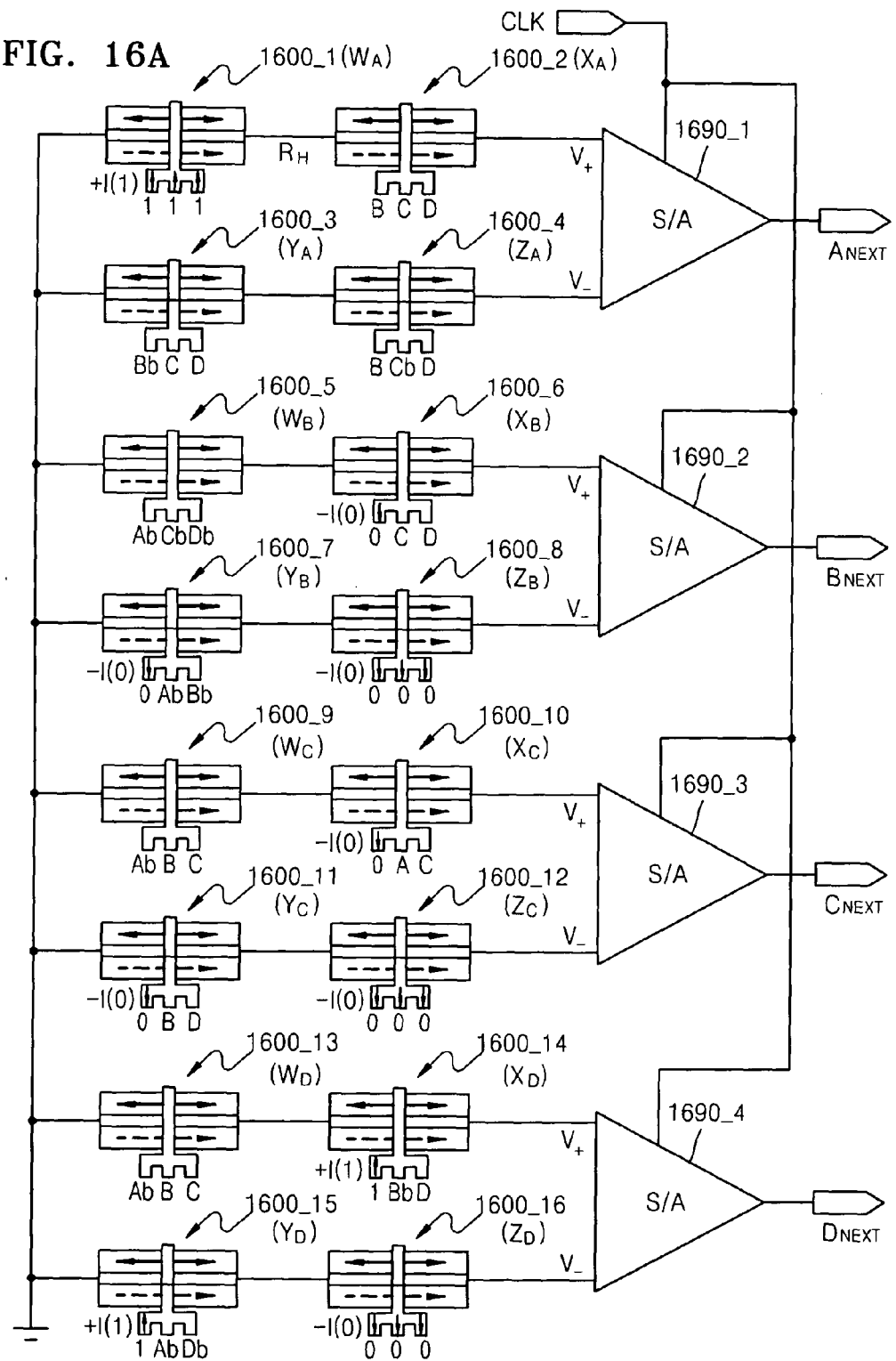

FIG. 16A illustrates a configuration of a 4-bit gray counter according to an embodiment of the present invention, FIG. 16B illustrates logical expressions representing the operation of the 4-bit gray counter illustrated in FIG. 16A, and FIG. 16C illustrates a logic table for explaining the operation of the 4-bit gray counter illustrated in FIG. 16A. Referring to FIGS.

16A, 16B and 16C, the logic circuit illustrated in FIG. 16A performs a 4-bit gray counting operation.

Figure 17A:
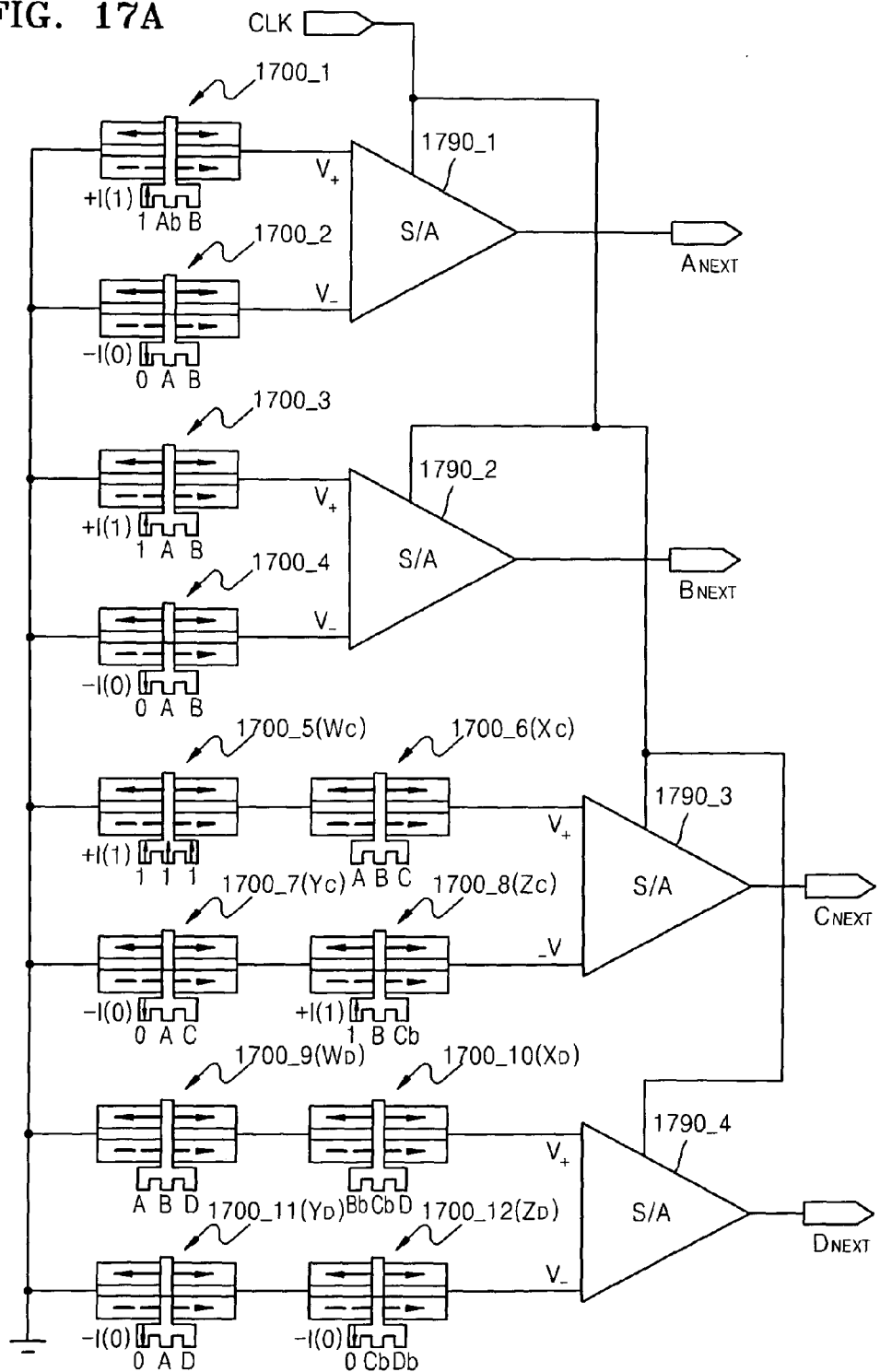

FIG. 17A illustrates a configuration of a 4-bit up-counter according to an embodiment of the present invention, FIG. 17B illustrates logical expressions representing the operation of the 4-bit up-counter illustrated in FIG. 17A, and FIG. 17C illustrates a logic table for explaining the operation of the 4-bit up-counter illustrated in FIG. 17A. Referring to FIGS. 17A, 17B and 17C, the logic circuit illustrated in FIG. 17A performs a 4-bit up-counting operation.

Figure 18A:
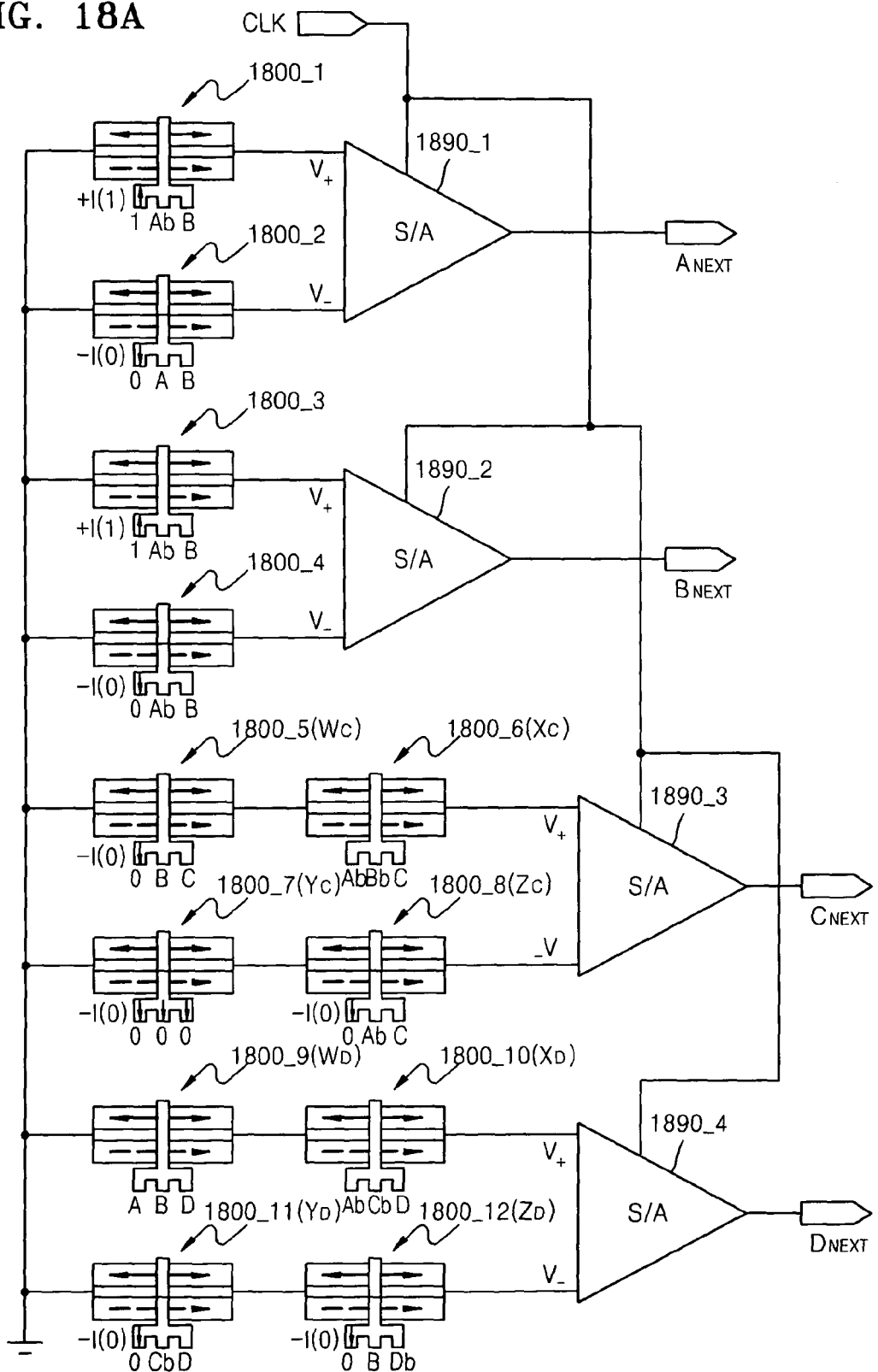

FIG. 18A illustrates a configuration of a 4-bit down-counter according to an embodiment of the present invention, FIG. 18B illustrates logical expressions representing the operation of the 4-bit down-counter illustrated in FIG. 18A, and FIG. 18C illustrates a logic table for explaining the operation of the 4-bit down-counter illustrated in FIG. 18A. Referring to FIGS. 18A, 18B and 18C, the logic circuit illustrated in FIG. 18A performs a 4-bit down-counting operation.

Those of ordinary skill in the art will understand the structures and operations of the 4-bit counters illustrated in FIGS. 16A, 17A and 18A with reference to the structures and operations of the logic circuits illustrated in FIGS. 3 through 15 so that detailed explanations thereof will be omitted.

FIG. 19A illustrates a configuration of an adder according to an embodiment of the present invention, and FIG. 19B illustrates logical expressions representing the operation of the adder illustrated in FIG. 19A.

Referring to FIGS. 19A, 19B and 19C, a first resistance-variable element 1900_1 has a fixed low resistance. That is, the logic operation result of the first resistance-variable element 1900_1 is 0. A second resistance-variable element 1900_2 has a resistance corresponding to a logic operation result of (A*B)+(B*C)+(C*A), (refer to FIG. 3). A first sense amplifier 1990_1 outputs a logic high signal when the second resistance-variable element 1900_2 has a high resistance and outputs a logic low signal when the second resistance-variable element 1900_2 has a low resistance. That is, the output Cout of the first sense amplifier 1990_1 corresponds to (A*B)+(B*Cin)+(Cin*A).

A third resistance-variable element 1900_3 has a resistance corresponding to a logic operation result of (A*Bb)+(Bb*Cinb)+(Cinb*A). A fourth resistance-variable element 1900_4 has a resistance corresponding to a logic operation result of (A*B)+(B*Cinb)_(Cinb*A). A fifth resistance-variable element 1900_5 has a resistance corresponding to a logic operation result of (A*Bb)+(Bb*Cin)+(Cin*A).

When the logic operation results of the second, third, fourth and fifth resistance-variable elements 1900_2, 1900_3, 1900_4 and 1900_5 are applied to the logic gate illustrated in FIG. 12A, the output of a second sense amplifier 1990_2 becomes S in the logical expressions of FIG. 19B.

FIG. 19C illustrates the outputs of the first, second and third sense amplifiers 1990_1, 1990_2 and 1990_3 in response to the three input values A, B and C. It can be known from FIG. 19C that the logic circuit illustrated in FIG. 19A performs a full adder operation.

As described above, the semiconductor memory device and the magneto-logic circuits according to the present invention change the direction of a magnetically induced current flowing in a magnetic induction layer according to a combination of a plurality of input values. Accordingly, the number of magnetic induction layers can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a current driving circuit receiving a plurality of input values and outputting a magnetically induced current, wherein the direction of the magnetically induced current is changed according to a logical combination of logic states of the input values;
   at least one magnetic induction layer having a magnetic direction according to the direction of the magnetically induced current; and
   a resistance-variable element varying its resistance according to the magnetic direction of the magnetic induction layer.

2. The semiconductor memory device of claim 1 consists of one said magnetic induction layer.

3. The semiconductor memory device of claim 1, wherein the number of magnetic induction layer is smaller than the number of input values.

4. The semiconductor memory device of claim 1, wherein the current driving circuit receives three input values and changes the direction of the magnetically induced current according to a logical combination of the three input values.

5. The semiconductor memory device of claim 4,
   wherein the three input values includes a first input value, a second input value, and a third input value; and
   wherein the logical combination of the three input values corresponds to the logical sum of the logical product of the first input value and the second input value, the logical product of the second input value and the third input value, and the logical product of the third input value and the first input value.

6. The semiconductor memory device of claim 4, wherein the current driving circuit fixes one of the three input values, receives the remaining two input values, and changes the direction of the magnetically induced current according to a logical combination of the fixed input value and the received two input values.

7. The semiconductor memory device of claim 1, wherein the current driving circuit receives two input values and changes the direction of the magnetically induced current according to a logical combination of the two input values.

8. The semiconductor memory device of claim 1, wherein the variable resistor comprises:
   a fixed magnetic layer having a fixed magnetic direction irrespective of the direction of the magnetically induced current; and
   a free magnetic layer having a magnetic direction according to the direction of the magnetically induced current,
   wherein the resistance-variable element varying its resistance according to the magnetic directions of the fixed magnetic layer and the free magnetic layer.

9. The semiconductor memory device of claim 8, wherein the resistance-variable element further comprises an insulating layer disposed between the fixed magnetic layer and the free magnetic layer.

10. The semiconductor memory device of claim 1, further comprising a pair of resistance measurement lines measuring the resistance of the resistance-variable element.

11. The semiconductor memory device of claim 1, wherein the magnetic induction layer comprises a metal line.

12. A semiconductor memory device comprising:
   a current driving circuit receiving a plurality of input values and outputting a magnetically induced current, wherein the direction of the magnetically induced current is changed according to a logical combination of logic states of the input values; and at least one memory cell having a single magnetic induction layer having a magnetic direction according to the direction of the magnetically induced current, and a resistance-variable element varying its resistance according to the magnetic direction of the magnetic induction layer.

13. A magneto-logic circuit comprising:

a current driving circuit receiving a plurality of input values and outputting a magnetically induced current, wherein the direction of the magnetically induced current is changed according to a logical combination of the input values; and at least one magnetic memory cell having a resistance varying according to the direction of the magnetically induced current.

14. The magneto-logic circuit of claim 13, wherein the at least one magnetic memory cell comprises:

at least one magnetic induction layer having a magnetic direction varying according to the direction of the magnetically induced current; and a resistance-variable element varying its resistance according to the magnetic direction of the magnetic induction layer.

15. The magneto-logic circuit of claim 14 consists of one said magnetic induction layer.

16. The magneto-logic circuit of claim 14, wherein the number of magnetic induction layer is smaller than the number of input values.

17. The magneto-logic circuit of claim 14, wherein the current driving circuit receives three input values and changes the direction of the magnetically induced current according to a logical combination of the three input values.

* * * * *